US008756540B1

(12) United States Patent
Baeckler et al.

(10) Patent No.: US 8,756,540 B1
(45) Date of Patent: Jun. 17, 2014

(54) METHOD AND APPARATUS FOR EXTRACTED SYNTHESIS GATE CHARACTERISTICS MODEL

(75) Inventors: Gregg William Baeckler, San Jose, CA (US); Barbette Van Antwerpen, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 1222 days.

(21) Appl. No.: 12/229,816

(22) Filed: Aug. 27, 2008

(51) Int. Cl.
*G06F 17/50* (2006.01)

(52) U.S. Cl.
USPC .......................................... 716/104; 716/101

(58) Field of Classification Search
USPC .................................................. 716/100–108
See application file for complete search history.

(56) References Cited

U.S. PATENT DOCUMENTS 6,463,567 B1 * 10/2002 Kozai ............................ 716/103
6,643,832 B1 * 11/2003 Ray et al. ...................... 716/108
7,337,100 B1 * 2/2008 Hutton et al. ................... 703/13
2004/0243964 A1 * 12/2004 McElvain et al. ............... 716/12
2007/0157138 A1 * 7/2007 Ciolfi et al. ...................... 716/4

OTHER PUBLICATIONS

De Micheli, G., Synthesis and Optimization of Digital Circuits, 1994, Chapter 8.6, pp. 418-426, McGraw Hill, Inc., Stanford University.
Rubin, S. M., Computer Aids for VLSI Design, 1994, Chapter 6, pp. 1-6, http://www.rulabinsky.com/cavd/text/chap06-5.html.
Schlip, W. J. et al., "Unit Delay Simulation with the Inversion Algorithm," IEEE, 1996.

* cited by examiner

*Primary Examiner* — Binh Tat
(74) *Attorney, Agent, or Firm* — Mauriel Kapouytian Woods LLP; Michael Mauriel

(57) ABSTRACT

Method and apparatus are described for improved circuit synthesis by EDA machinery. Circuit designs are synthesized to a target hardware platform with resulting hardware characteristics correlated back to component types in the synthesis-stage circuit design. The accumulated characteristics samples then contribute to a characteristics value for the component type. The characteristics value can be used in future synthesis runs to condition processing, e.g., choosing between alternative implementation possibilities, using the characteristics value to provide an accurate prediction of a hardware implementation for the component type.

46 Claims, 6 Drawing Sheets

*(A)*

*(B)*

METHOD AND APPARATUS FOR EXTRACTED SYNTHESIS GATE CHARACTERISTICS MODEL

BACKGROUND

In modern electronic engineering practice, new functional circuitry is designed by preparing a circuit description in computer readable format. For maximum efficiency, even the most detailed circuits are prepared as a description of desired function rather than as a description of a precise hardware implementation. EDA (electronic design automation) software processes the functional circuit description to eventually produce an exact and specific implementation for a chosen target hardware platform.

A synthesizer component of EDA software plays a major role in the movement from functional to hardware-specific circuit design. Synthesizer software, generally executed on a general purpose computing platform, constantly makes choices and trade-offs from among the myriad of possible combinations of abstract synthesis or concrete hardware elements that could effect the functional design. The choices and trade-offs are conditioned by synthesizer design and control information that may be dynamically evaluated. Improvements in the dynamic evaluation can result in better target hardware implementations.

SUMMARY

Aspects of the invention provide methods and apparatus for improved circuit synthesis by EDA machinery. Improved circuit synthesis results because the synthesizer apparatus conditions circuit design choices based on more accurate predictions of characteristics, such as delay time, that a number of circuit design alternatives would each have when physically implemented in the target hardware.

In one aspect of the invention a method is disclosed for producing a component characteristics model for a target hardware platform wherein a large number of small circuit designs are fully synthesized. Various outputs of the synthesis are further processed to yield a component characteristics model that includes, for each type of synthesis gate in the model, characteristics information that accurately reflects the likely hardware implementation for that gate. Characteristics information in the model may include, for example, delay time.

In another aspect of the invention, electronic design automation (EDA) apparatus is disclosed including a synthesizer utilizing a component characteristics model such as that produced by the aforementioned method.

In another aspect of the invention, apparatus is disclosed useful to supply a component characteristics model such as that produced by the aforementioned method to computing machinery configured to perform EDA processing.

These and other aspects of the invention will become apparent to one of skill in the art after reading the detailed description that follows.

DETAILED DESCRIPTION

Methods and apparatus are described below that can produce more highly optimized EDA circuit synthesis. Better synthesis is obtained than before possible because synthesizer decision-making is conditioned at the more abstract synthesis modeling stages using inventive synthesis gate models. The inventive synthesis gate models more accurately reflect characteristics of the resultant target hardware model when implemented.

The descriptions below include a large amount of detail in order to aid a clear understanding of what has been invented. Many implementations employing the inventive matter are possible and implementation details shown and discussed for the described embodiments should not be considered as limiting the scope of the invention. Similarly, much unnecessary detail about the described embodiments has been omitted in order not to obscure or burden a ready understanding of the inventive matter as one of skill in the art will appreciate.

Figure 1:
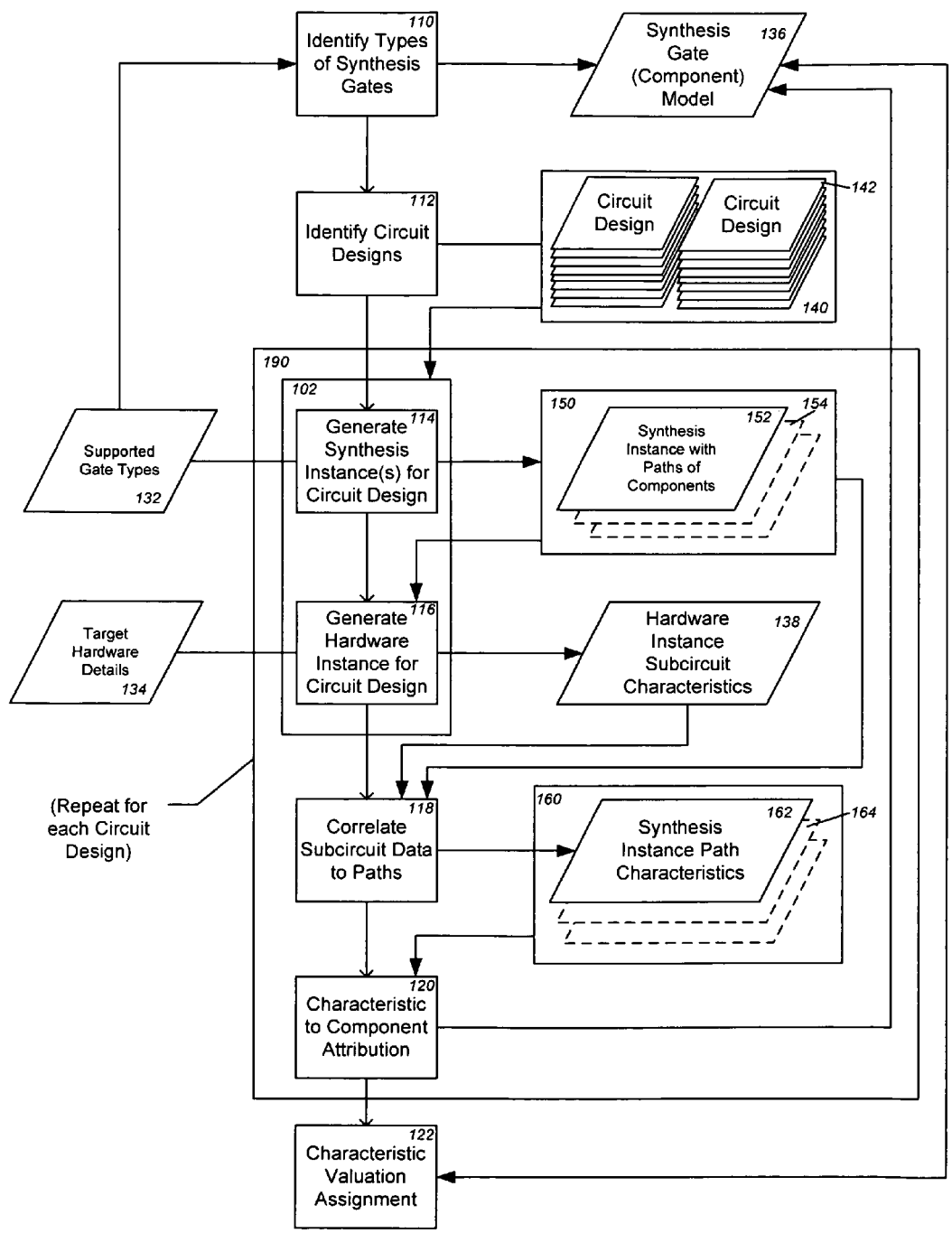
FIG. 1 depicts a flow chart for one embodiment practicing inventive aspects.

FIG. 1 depicts a flow chart for one embodiment practicing inventive aspects. In the depicted process, a synthesizer not having the benefit of the inventive synthesis models is used to synthesize a large number of small circuit designs all the way to a common specific target hardware platform. One or more characteristics for subcircuits in the resulting hardware design instances, such as delay time, are correlated back to corresponding circuit paths in synthesis circuit design instances that preceded the hardware design instances. The correlated circuit path characteristics are then attributed among the one or more components, i.e. synthesis gates (or, more specifically, their connection points), included in the circuit path. For example, a delay time value may be attributed to each of three circuit path components simply by dividing the circuit path delay time value by 3. Each attributed value is used as a sample for the component type. After all circuit designs are so processed, the aggregate samples for each component type are used to assign a characteristic value to the component type. For example, simple averaging of all delay time samples for the particular component type may be used to assign a delay time value to the component type as part of a synthesis gate model. In a preferred embodiment, the EDA synthesizer (102) used in the FIG. 1 process is subsequently adapted to operation utilizing the synthesis component model that resulted from the FIG. 1 process, yielding an enhanced EDA synthesizer with superior design choice conditional processing.

Process flow begins at block 110 where an identification is made of the specific types of synthesis gates that may be characterized by the process. The identification of the synthesis gate types results in one embodiment in a list of gate types as represented by data block 136. The list of identified types includes all of the functional circuit components recognized and supported by a targeted EDA synthesizer, from the simplest logic gates (e.g., inverters, 2-input NAND, NOR, AND, OR, and XOR gates) to the most complex components processed by the synthesizer (each, a synthesis gate or component). Data block 132 represents a list of supported gate types associated with a particular target synthesizer as may be utilized to produce the list or records of 136. Alternatively, identification of synthesis gate types can occur later in the process, such as when characteristics data for the gate types becomes available (for example, at block 120). One of skill in the art recognizes that synthesis gate types can be identified in a data processing system in ways other than making a list. For example, in another embodiment synthesis gate types can be identified by inclusion of a mark or particular value in unique data records. For another example, in other embodiments synthesis gate types can be identified by utilizing the placement of a gate type name at a particular position in a data record or data stream. Other methods and mechanisms may be used by one of skill the art to establish or recognize the identifying information of synthesis gate types.

Processing proceeds from block 110 to block 112 where circuit designs are identified. Block 140 represents a collection of individual circuit designs, such as 142, associated with the identification processing 112. Preferably, the collection 140 contains a very large number of circuit designs and each individual circuit design (e.g., 142) is very simple. Simple circuit designs are preferable because each circuit design will undergo certain EDA processing, and the computing resources for the EDA processing tends to increase non-linearly with circuit complexity. Circuit design collection 140 preferably includes a very wide variety of the component types supported by the synthesizer, with many instances of each component type across the collection of circuit designs. Exemplar circuit designs are discussed later in reference to FIG. 2.

A circuit design, such as 142, may be in any computer readable format recognizable, directly or indirectly, to the synthesizer. In the preferred embodiment, each of the circuit designs in collection 140 is represented in VHDL format.

Identification processing 112 in one practice involves the generation of each of the circuit designs in collection 140. A preferred embodiment includes the parameter driven automated generation of VHDL for such circuit designs. Various tools and approaches may be employed for automated generation of circuit designs. The following references can be appreciated: (i) M. Hutton, J. P. Grossman, J. Rose and D. Corneil, "Characterization and Parameterized Random Generation of Combinational Benchmark Circuits", IEEE Transactions on CAD 17:10, October, 1998, pp. 985-996; (ii) K. Prakobwaitayakit, K. and N. Fujii, "A Neural Network Approach to Circuit Topology Generator," Circuits and Systems, IEEE APCCAS, 2000, pp. 93-96; and (iii) HDLMaker user guide and software by Polybus Systems Corp. of Westford, Mass. (http://www.polybus.com/hdlmaker/users_guide). In other practices, identification processing 112 may involve the specification, recognition, recordation, locating, or user solicitation, for example, of the name of a computer file system directory that contains a collection of circuit designs such as 140. In other practices, identification processing 112 may involve similar actions with regards to a computer text file containing the names or other locating information for further computer system files that have circuit designs.

Many alternatives are available for the particulars of circuit design identification processing. As another example, identification processing 112 may be segmented with a first subset of circuit design collection 140 being identified, followed by other processing, followed by the identification of a second subset of circuit design collection 140, and so on.

Circuit design collection 140 preferably includes for a significant proportion of the different synthesis gate types, a large number of circuit designs including that particular gate type. Circuit design collection 140 preferably includes for many, most, almost all, or all synthesis gate types about 200 or more individual circuit designs, and even more preferably about 500 or more individual circuit designs, even more preferably about 1,000 or more individual circuit designs, and even more preferably about 2,000 or more individual circuit designs, and somewhat more preferably about 5,000 or more individual circuit designs. All of the circuit designs within collection 140 that contain a particular type component in common may be viewed logically together as a group within the overall collection, and a circuit design with multiple component types will obviously belong to multiple such groups.

Processing proceeds from block 112 to block 114. Box 102 indicates that the processing of blocks 114 and 116 is performed using the EDA tool (including synthesizer) that is targeted for the characteristics model produced by the process depicted here in FIG. 1. The EDA tool of the preferred embodiment is Quartus® II product from Altera Corporation, 101 Innovation Drive, San Jose, Calif. Moreover, the processing of block 114 begins a portion of the overall process depicted in FIG. 1, that is repeated for each of the individual circuit designs, such as 142, in collection 140. This repeated portion of the process is identified by box 190.

At block 114 the EDA synthesizer reads a circuit design from collection 140 producing one or more instances of synthesized circuit designs 150. Block 152 with a solid outline represents a synthesized version or instance of the input circuit design. Other blocks within block 150 having a dashed outline, such as block 154, represent other instances that may be generated by a synthesizer to move the circuit design from its input functional representation to a particular instance or implementation of target hardware circuit elements that effect the function represented in the circuit design. The use of multiple stages of synthesis in EDA processing is a well understood in the art. In the preferred embodiment, the various instances of a circuit as synthesized can be captured in computer readable form for subsequent processing as represented by the contents of block 150. Examples of varying instances are discussed later in relation to FIG. 3.

Generally speaking, the input circuit design will contain synthesis components with the highest level of functional abstraction. Later instances of the synthesized circuit tend to progressively move the circuit design to implementation with components of lower abstraction until an unabstracted hardware design instance is generated. Each synthesized circuit design will include circuit paths. Each circuit path includes two recognizable end points and one or more circuit components connected therebetween (i.e., a string of components). In the preferred embodiment, the endpoints are register inputs or outputs recognized by name.

Processing proceeds from block 114 to block 116 where a hardware design instance is generated for the input circuit design using the results of the earlier synthesis processing. Block 116 generates the hardware design instance using circuit element, performance, physical, and other information for a specific target hardware platform as represented by block 134. The hardware design instance for a circuit design, such as that represented by block 138, will include subcircuits that each include two recognizable end points and one or more hardware circuit elements connected therebetween (i.e., a string of hardware elements). The hardware design instance 138 includes information regarding characteristics, such as delay time, including those for individual subcircuits. The characteristics information is highly accurate, based on a known and proven physical implementation. (While delay time is used repeatedly herein as an example to discuss characteristics information, one familiar with the art understands that many other types of characteristics information are possible. Capacitance and die area are but two further specific examples with more broadly defined categories including, for example, operational performance, electrical properties, dimensional properties, and more broadly, physical properties information.) Where the target hardware platform is an FPGA, the characteristics information will generally have been provided by the manufacturer of the particular FPGA part. As another example, where the target hardware platform is an ASIC manufactured using a specific process technology, the characteristics information will generally have been provided by the developer of the process technology. In the preferred embodiment, endpoints of subcircuits include points in the circuitry that correspond to the register inputs and outputs serving as endpoints for paths in the related synthesis instances, and can be matched by name.

Processing proceeds to block 118 where characteristics information of the hardware design instance is correlated with the paths in the earlier related synthesis design instances. A particular circuit path in a synthesis design instance is identified by the names of its endpoints, and characteristics information regarding a subcircuit with corresponding endpoints is identified within the hardware design instance 138. The characteristics information is then associated with the synthesis design instance circuit path. This association is represented in FIG. 1 by box 160. Box 160 includes three data blocks; one having a solid outlined 162, and two having dashed outlines, such as 164. Box 160 and its contents parallel that of box 150. The parallelism is intended to depict that the correlation processing of box 118 is preferably performed for the paths of all available instances of the synthesized circuit design, without specific regard to its level of abstraction or the stage at which it was produced. Taking advantage of all reasonable synthesis instances produced by EDA processing of the input circuit design increases the number of samples contributed by the individual circuit design. Accordingly, fewer computing resources are required to be expended to generate sufficient samples to achieve desirable levels of component characteristics accuracy in the synthesis gate model produced by the process of FIG. 1.

Processing proceeds to block 120 where the characteristics information now associated with synthesis instance paths is attributed to the specific types of the individual components within those paths. In the preferred embodiment that creates a synthesis gate model having delay time characteristics information, attribution is generally performed by calculating for each component in the path an equal portion of the overall delay time for the path. The value attributed to each component is then used as one sample for the type of the component. For example, the value attributed to a particular 2-input NAND gate identified as GATE137 (not illustrated) within a synthesis circuit design instance, such as 152 of FIG. 1, becomes a sample for the generic 2-input NAND gate type, as opposed to a sample for the specific GATE137. Attribution resulting in gate type samples is represented in FIG. 1 by the arrow directed from block 120 to block 136.

Processing proceeds to step 122 after the processing of block 120 for the last of the collection of circuit designs 140. At block 122, a characteristic information assignment takes place for each of the component types having samples according to the processing of box 190. The processing of block 122 results in a synthesis component characteristics model associated with the same target hardware platform as is block 134. Assignment and recordation in computer readable form of the characteristic information for the component types in the synthesis model is represented in FIG. 1 by the line connecting blocks 122 and 136.

In some cases, assignment may be as straightforward as merely averaging together the values of all the related numerical samples for the component type. For example, all of the delay time samples for the single select input on a 2-input mux can be averaged and the result assigned as the characteristic value for the select input. A simple average is only one example and assignment processing may advantageously employ one or more different calculation processing, including other statistical calculations such as the median or removal of outlying values. Different assignment processing can be used, for example, to achieve particular design goals or exploit information known about particular target hardware platform technologies. The simple average produces an accurate model with economical computing resources.

In a preferred embodiment, all of the delay time samples for both of the data inputs of a 2-input AND are averaged together and the result is assigned as the characteristic value to each of the two data inputs. Such balancing can be implemented wherever reasonably expected from the physical implementation (for example, as here, where it is reasonable to expect the same time delay to output from either input on an AND gate). In the case of the 2-input mux, the select (control) input would not be balanced with the two data inputs of the mux because it is reasonable to expect those input types (data and control) to behave differently and have different typical delay time characteristics.

The combination of reasonable assignment processing at the output and a large number of circuit designs at the input contributes to the predictive accuracy characteristic of data of a high-sample probabilistic model (HSPM) for a target hardware platform. The synthesis component model that is output by block 122, as represented by block 136, is preferably in a form and format that facilitates its subsequent integration with components of EDA computing machinery to influence the conditional processing effecting EDA internal design choices. In one embodiment, the synthesis model can be selectively represented as computer program-like "case" statements or as a tabular format. In either case the representation is recognized by an EDA synthesizer as a timing model in this example. In a preferred embodiment, the same EDA synthesizer (102) used in the FIG. 1 process is the one subsequently adapted to operation utilizing the synthesis component model (136) that resulted from the FIG. 1 process, yielding an enhanced EDA synthesizer with superior design choice conditional processing. The process of FIG. 1 can be advantageously repeated to yield different component characteristic models for a common synthesizer targeting different hardware platforms, and, similarly repeated to yield different component characteristic models for a common hardware platform targeted by different synthesizers.

Figure 2:
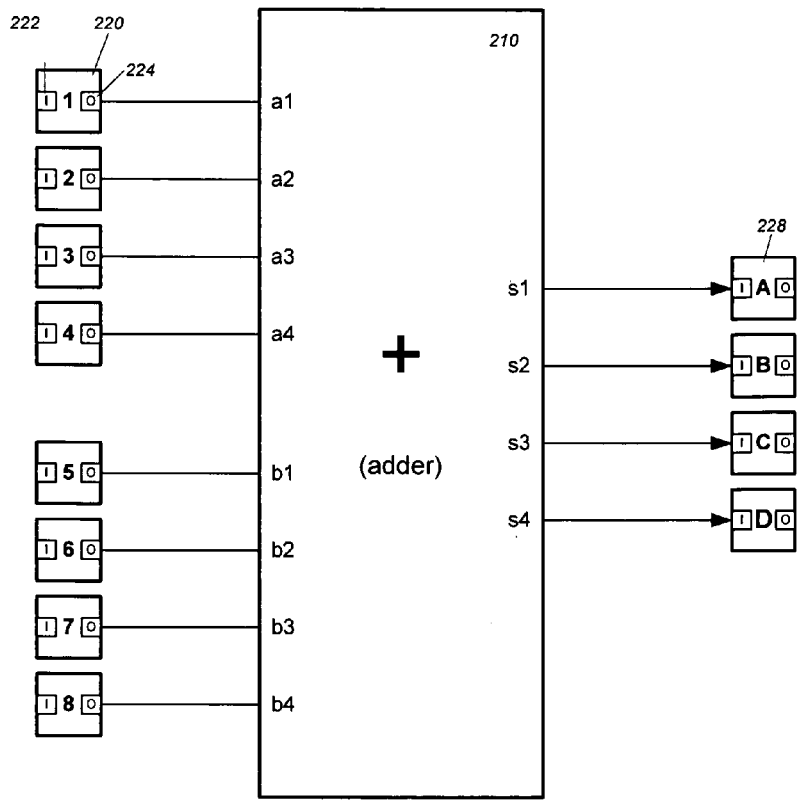
FIG. 2 (A-D) depicts illustrative circuit designs as may be useful in characteristics model development.
Figure 2:
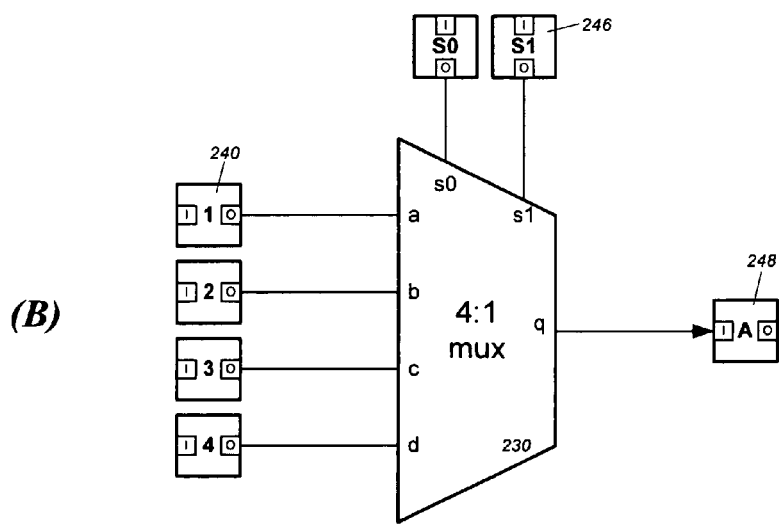
Figure 2:
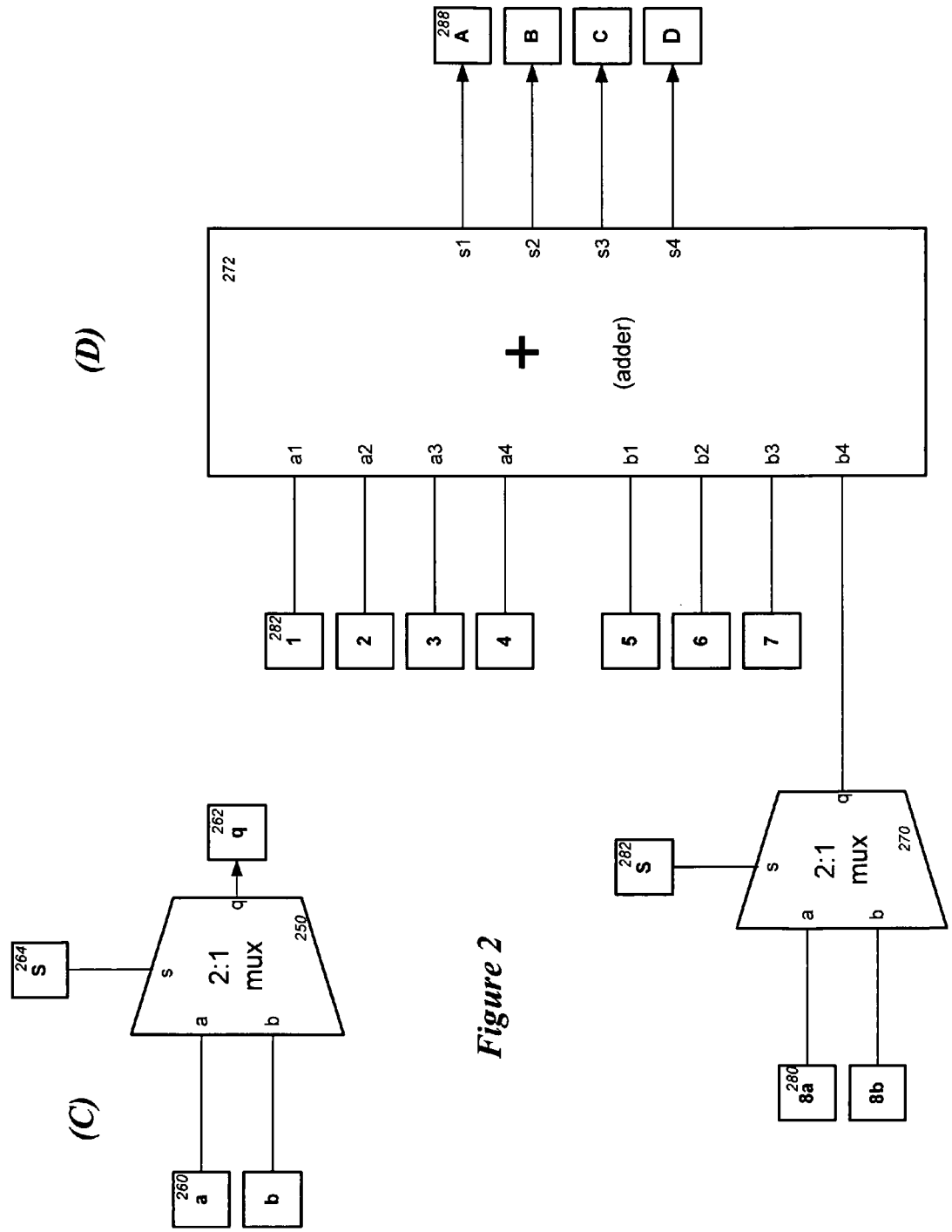

FIG. 2 (A-D) depicts illustrative circuit designs as may be useful in characteristics model development. In a preferred embodiment, circuit designs include register elements at inputs and outputs. Use of the registers facilitates recognition and collection of desired characteristics data (e.g., delay time) where the synthesizer can report hardware design characteristics for each register-to-register subcircuit. Register elements in the circuit design serve as a convenient common thread that carry forward from the circuit design to serve as component path endpoints in a synthesis design instance, and forward to serve as subcircuit endpoints in a hardware design instance. Subcircuit characteristics information for a hardware design instance can then be readily correlated back to corresponding synthesis design paths in the production of a synthesis characteristics model.

In a preferred embodiment, circuit designs are simple, being limited to a small number of synthesis gates (components) in addition to the aforementioned registers. Circuit designs of small component count advantageously reduce computing resources used in production of a synthesis characteristics model by avoiding geometric expansion concerns with EDA tools and by permitting simple attribution and evaluation processes to be utilized while still producing results with good accuracy. A preferred collection of circuit designs (such as 140 of FIG. 1) used in the production of a synthesis characteristics model has mostly, is predominated by, or consists almost completely of circuit designs having about 10 or fewer components, and preferably about five or fewer components, even more preferably four or fewer components, even more preferably three or fewer components, even more preferably two or fewer components, and even more preferably about one component. The aforementioned component counts are in addition to registers at inputs and outputs as discussed earlier. An incidental number of minor or trivial gates may also be omitted from the count when assessing the number of components in a circuit design. This small component count stands in stark contrast to the typical circuit design having a component count magnitudes greater.

FIG. 2A depicts an exemplar circuit design with an adder function block. Adder 210 has eight inputs, labeled a1-a4 and b1-b4, and four outputs, labeled s1-s4. Each input and output is connected to a register element. For example, register 1 (220) appearing to the input side of adder 210 has an input 222, an output 224, and has its output 224 connected to adder input a1. As another example, adder 210 output s1 is connected to the input of register A (228). In sum, the eight adder inputs, a1-a4 and b1-b4, are connected to the outputs of registers 1-8, respectively; and the four adder outputs, s1-s4, are connected to the inputs of registers A-D, respectively.

FIG. 2B depicts an exemplar circuit design with a 4-to-1 mux. Mux 230 has four data inputs, labeled a-d, connected to the outputs of four registers, labeled 1-4, respectively. Mux 230 has two select inputs, labeled s0 and s1, respectively connected to the outputs of two registers similarly labeled. Mux 230 has one data output, labeled q, connected to the input of register A (248).

FIG. 2C depicts an exemplar circuit design with a 2-to-1 mux. Mux 250 has two data inputs, labeled a and b, respectively connected to the outputs of two similarly labeled registers. Mux 250 has one select input, labeled s, connected to the output of a similarly labeled register 264. Mux 250 has one data output, labeled q, connected to the input of similarly labeled register 262.

FIG. 2D depicts an exemplar multicomponent circuit design that combines a 2-to-1 mux such as that of FIG. 2C (250) with an adder such as that of FIG. 2A (210). Mux 270 of FIG. 2D has two data inputs, labeled a and b, connected to the outputs of two registers, labeled 8a and 8b, respectively. Mux 270 has one select input, labeled s, connected to the output of a register 282, labeled S. Mux 270 has one data output, labeled q, connected directly to the input labeled b4 of adder 272. The remaining inputs of adder 272, labeled a1-a4 and b1-b3, are connected to the outputs of registers, labeled 1-7, respectively. The outputs of adder 272, labeled s1-s4, are connected to the inputs of registers, labeled A-D, respectively.

Figure 3:
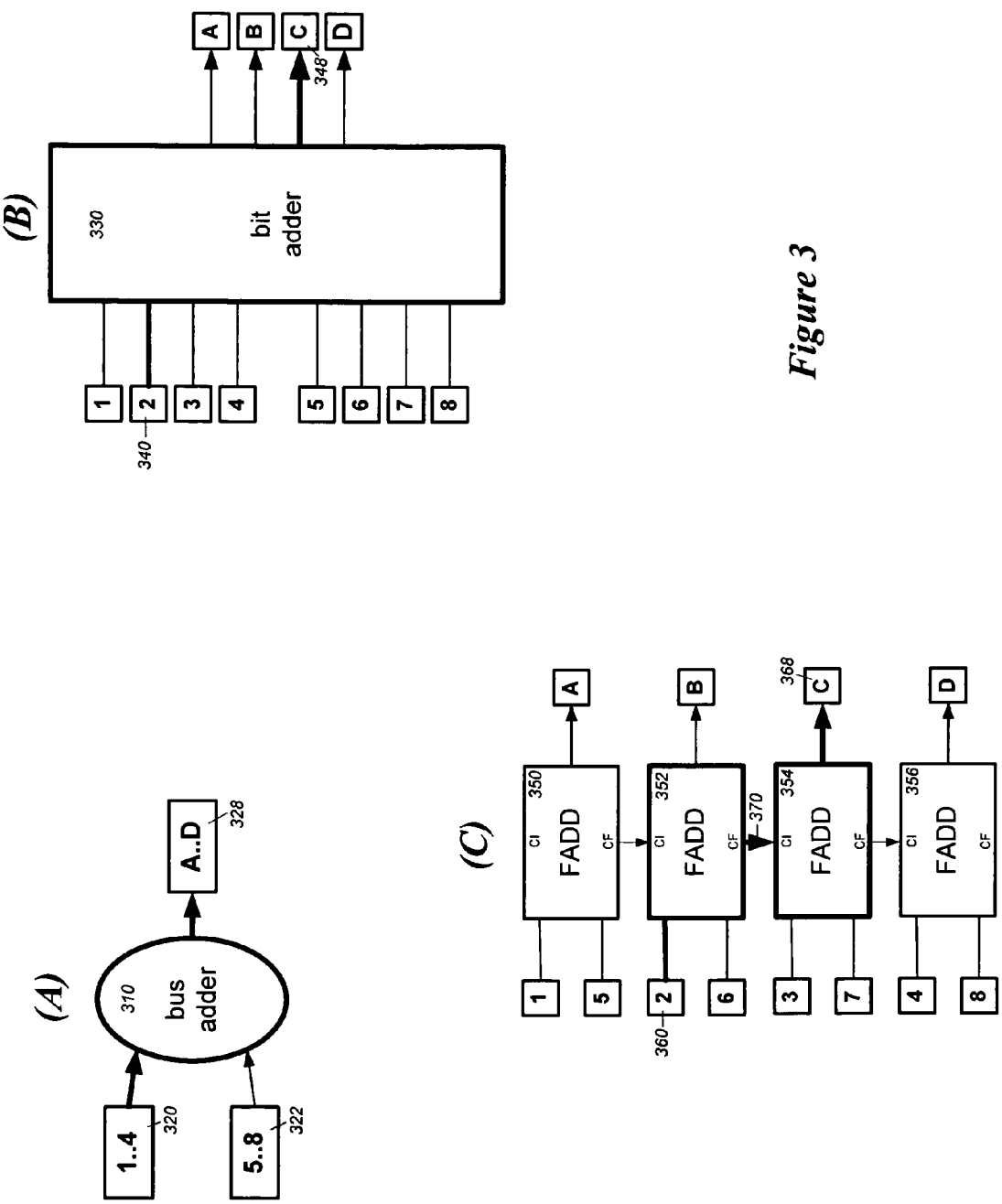
FIG. 3 (A-C) depicts synthesis designs associated with an underlying circuit design.

FIG. 3 (A-C) depicts synthesis designs associated with an underlying circuit design. Each is illustrative of a synthesis circuit instance that may result from EDA processing of the adder circuit design of FIG. 2A. Each is illustrative of a synthesis circuit instance such as illustrated and discussed in relation to FIG. 1 (152,154). FIG. 3A depicts an instance of the synthesized circuit design using a bus adder 310. Bus registers 320, 322 supply four individual input signals each to bus adder 310. Bus register 328 receives four individual output signals from bus adder 310. A component path is highlighted by bolding in FIG. 3A for purposes of illustration. The component path traverses from bus register 320 (bit 2, not individually shown) to bus register 328 (bit C, not individually shown) and is illustrated by the bold outline of bus adder 310 and the bold lines connecting adder 310 with those registers 320,328.

FIG. 3B depicts an instance of the synthesized circuit design using a bit adder 330. The examplar synthesis design instance of FIG. 3B substantially replicates the underlying circuit design depicted in FIG. 2A. The component path corresponding to the one highlighted in FIG. 3A is highlighted by bolding in FIG. 3B. The component path traverses from register 2 (340) to register C (348) and is illustrated by the bold outline of bit adder 330 and the bold lines connecting adder 330 with those registers 340, 348.

FIG. 3C depicts an instance of the synthesized circuit design using four full adders, 350-356. In addition to two data inputs and a sum output, each full adder, such as 352, has a carry in (CI) input to receive a carry signal from a lower magnitude stage and a carry forward (CF) output to send a carry signal to a higher magnitude stage. The component path corresponding to the one highlighted in FIG. 3A is highlighted by bolding in FIG. 3C. The component path traverses from register 2 (360) to register C (368) and is illustrated by the bold outlines of full adders 352, 354, the bold line between register 2 (360) and full adder 352, the bold line 370 connecting the carry forward output of full adder 352 to the carry forward input of full adder 354, and the bold line connecting between full adder 354 and register C (368).

Preferably, component paths of the synthesis design instances can be identified at fine enough resolution to exclude any circuitry of the input and output registers and isolate the component path definition from a register output connection point to a register input connection point. Embodiments that include all or part of register circuitry in the identifiable component paths preferably compensate for the presence of registry circuitry, for example, by making corresponding adjustments when attributing characteristics values to components in the path (e.g., make a corresponding reduction in delay time values). Good results may, however, be achieved in embodiments not making such consideration for register circuitry at the periphery of component paths.

Figure 4:
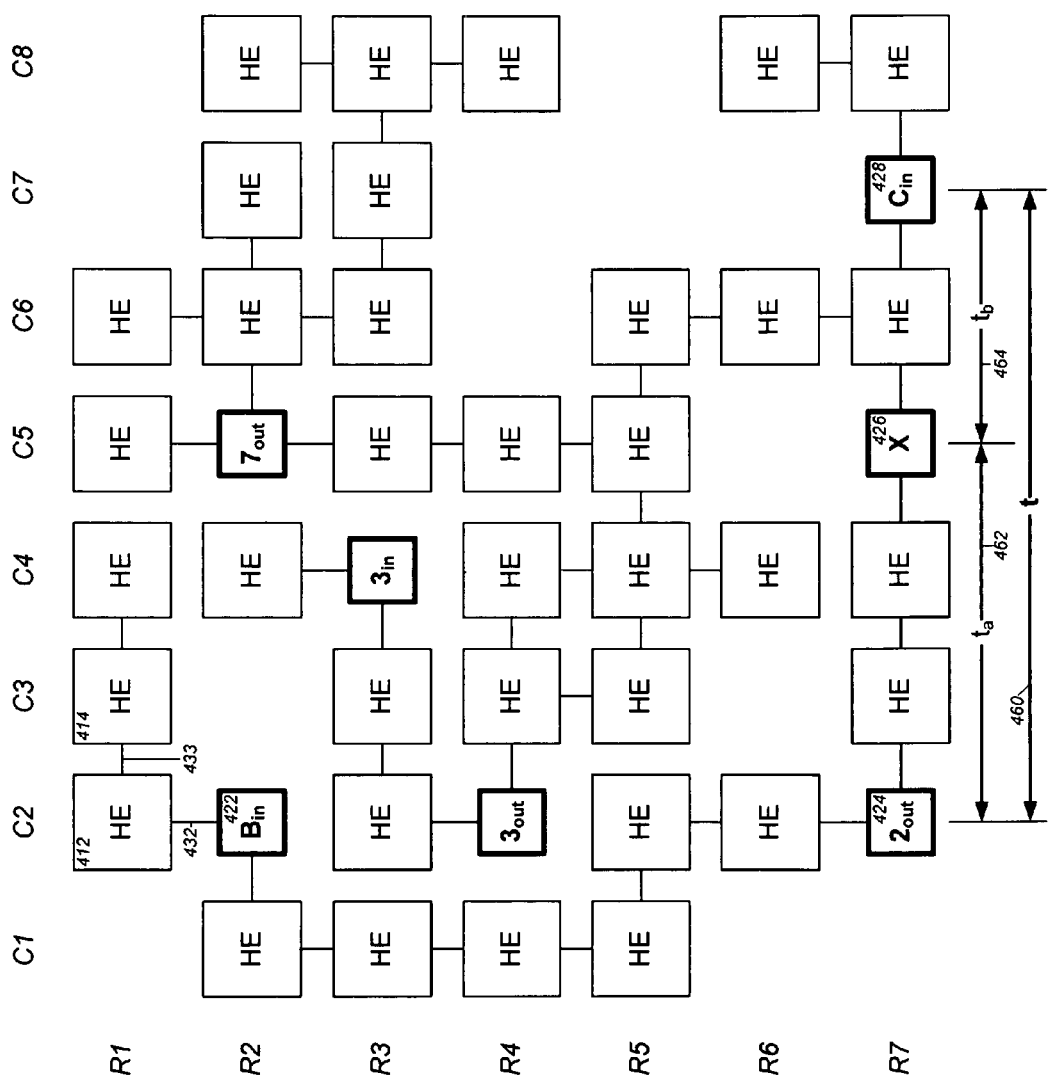
FIG. 4 depicts a target hardware design portion associated with an underlying circuit design.

FIG. 4 depicts a target hardware design portion associated with an underlying circuit design. FIG. 4 is a highly stylized illustration of a portion of circuitry of a hardware design instance as might result from EDA processing (such as discussed in regards to 116 of FIG. 1). Circuit elements are shown in a grid of columns C1-C8 and rows R1-R7. Blocks labeled HE represent hardware elements. For example, in an FPGA design a hardware element may be a device logic element. For another example, in an ASIC design a hardware element may be a transistor. As another example, in a mask programmed gate array design a hardware element may be a fundamental logic gate. Other blocks of FIG. 4 are smaller and bolder, and represent contact points—for example, points in the circuitry at the input or output of a particular register. Arrows 460-464 illustrate characteristics information of the hardware design instance.

FIG. 4 includes a signal path from point 424, through the hardware elements of columns C3 and C4 in row R7, through connection point 426, through the hardware element of column C6 in row R7, to connection point 428. The complete subcircuit from connection point $2_{out}$ (424) to connection point $C_{in}$ (428) illustrates a subcircuit corresponding to each of the component paths highlighted in FIG. 3A-C. Arrow 460 represents a delay time characteristic, t, for subcircuit $2_{out}$-to-$C_{in}$. Subcircuit $2_{out}$-to-$C_{in}$ includes two subcircuits. Subcircuit $2_{out}$ to-X has delay time characteristic $t_a$ (462). Subcircuit X-to-$C_{in}$ has delay time characteristic $t_b$ (462). In a preferred embodiment, a hardware design instance includes a subcircuit characteristics information item (such as t 460) that directly corresponds to a component path in a synthesis design instance (such as any of those highlighted and discussed in relation to FIG. 3). In other embodiments, a characteristics information item directly corresponding to a component path may be derived from other less direct or indirect characteristics information. For example, delay time values $t_a$ (462) and $t_b$ (464) of FIG. 4, could be added together to produce a delay time characteristics information item for subcircuit $2_{out}$-to-$C_{in}$ if value t (460) were not present in the hardware design instance.

Figure 5:
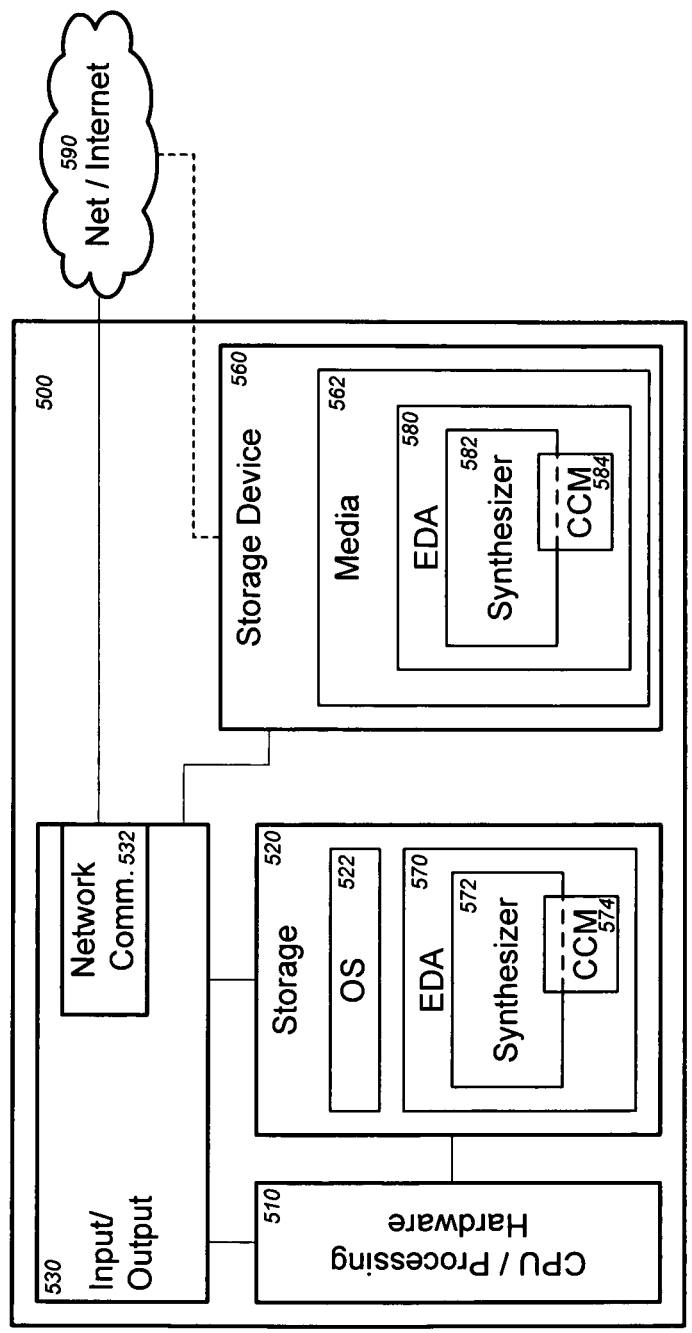
FIG. 5 depicts an exemplar computer system configuration for employing aspects of the invention.
Figure 1:
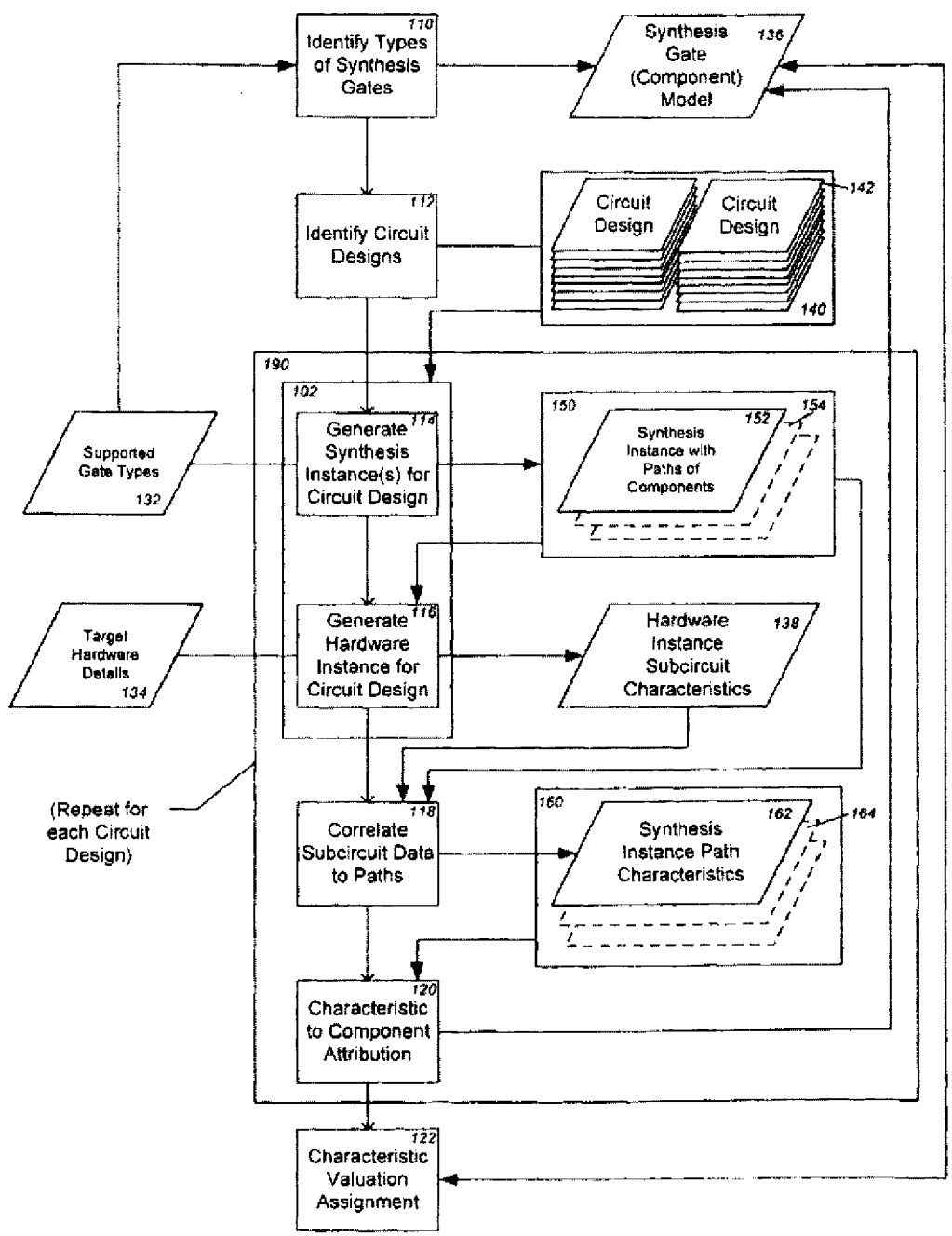
Figure 2:
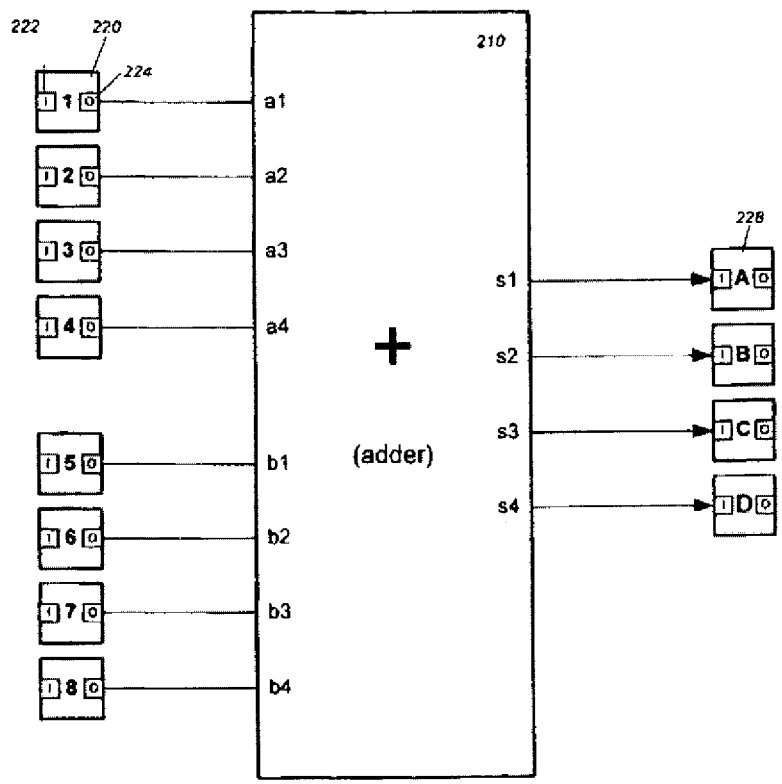
Figure 2:
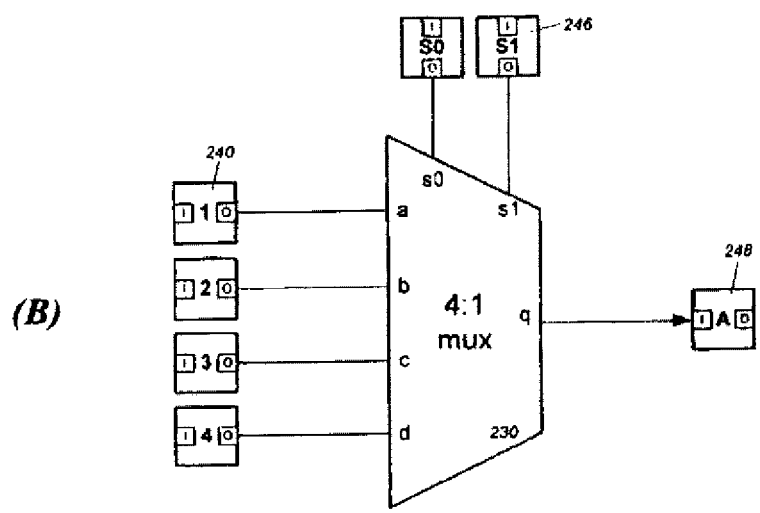
Figure 2:
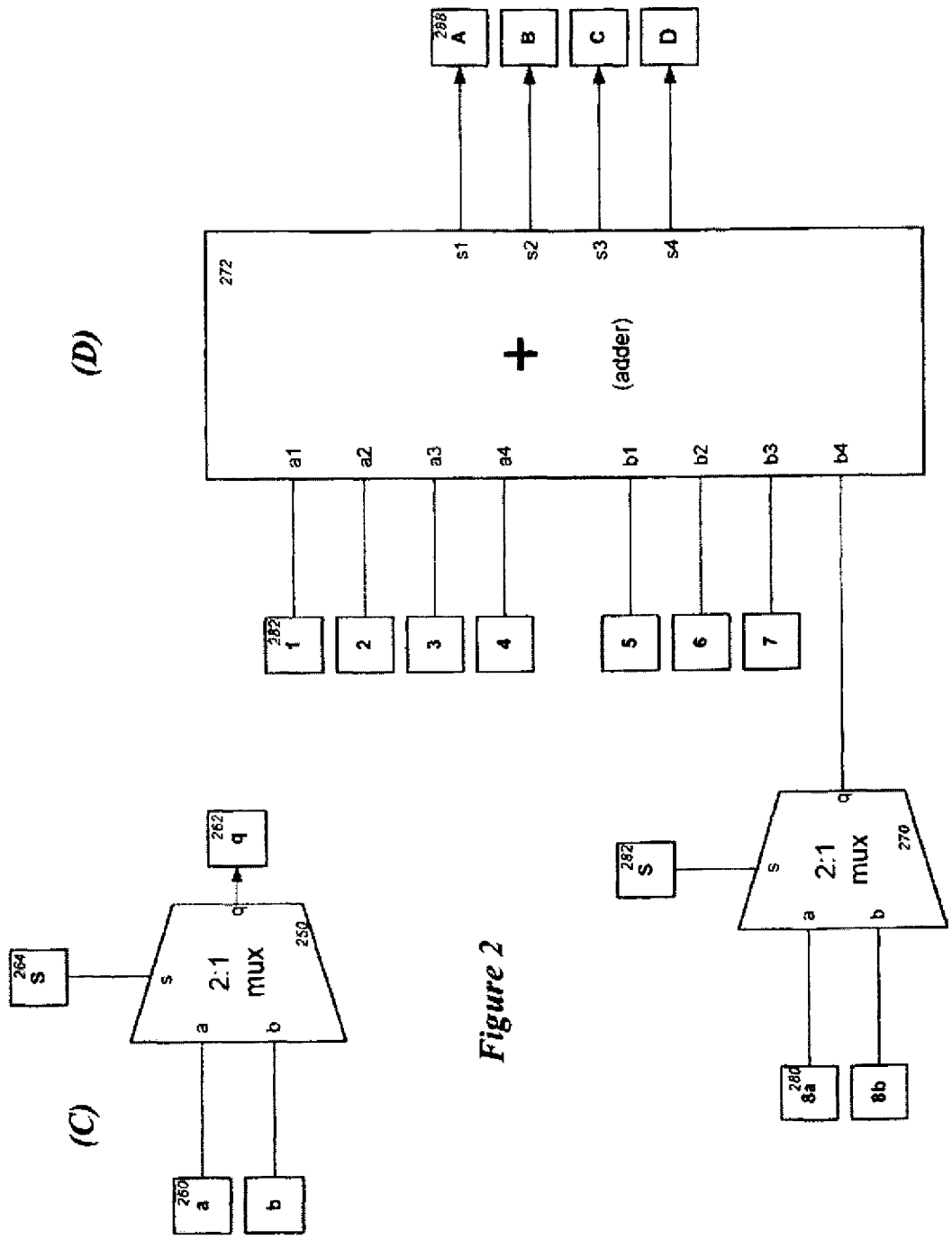
Figure 3:
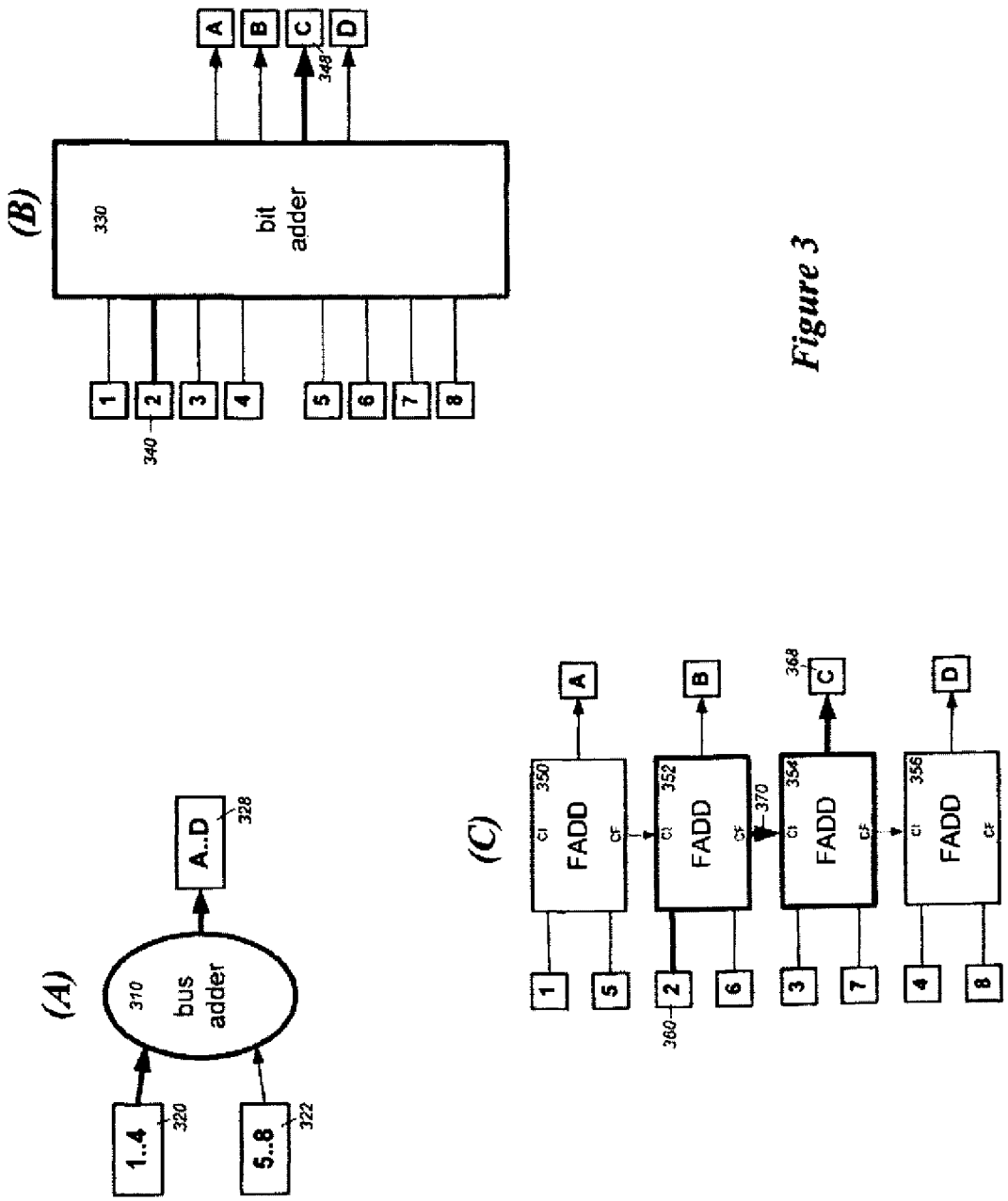
Figure 5:
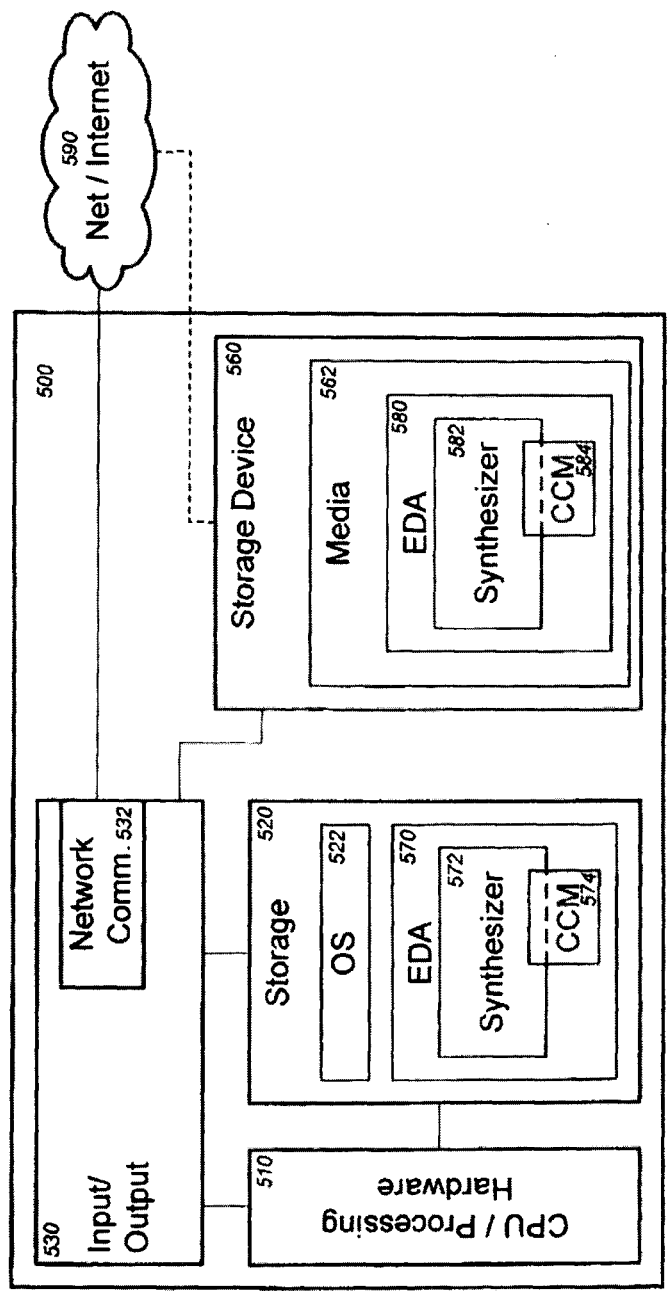

FIG. 5 depicts an exemplar computer system configuration for employing aspects of the invention. General-purpose computer 500 includes CPU/processing hardware 510, storage 520, input/output 530, and storage device 560. CPU/processing hardware 510 represents microprocessor, multi-processor, co-processor, or custom logic circuitry, for example, to carry out data processing functions such as the execution of computer software instructions. Storage 520 represents memory devices shown coupled to the CPU processing hardware 510 to provide it with high-speed access to program instructions and other computer data. Storage 520 may be implemented, for example, using any of a variety of RAM (e.g., SDRAM) or ROM (e.g., EEPROM) devices widely known in the art. Input/output 530 is shown coupled to CPU/processing hardware 510 and storage 520. Input/output 530 represents circuitry to interface between high-speed central processing circuitry and input/output devices. Storage device 560 is shown coupled to input/output circuitry 530. Storage device 560 may alternatively connect to computer 500 via external network 590 as in the case of a NAS storage device, as indicated by the dashed connection shown in FIG. 5. Storage device 560 represents circuitry and related apparatus used to store and/or retrieve computer data (which may include computer software). Storage device 560 generally involves persistent storage and is slower than storage 520. Storage device types useful in computer 500 include, for example, hard disk drives, optical drives such as CD-ROM, or flash memory devices such as USB sticks.

Storage 520 includes computer data storage locations (not individually shown) occupied by operating system software and related data 522, and the EDA software and related data 570. EDA locations 570 include storage locations occupied by synthesizer software and related data 572 and hardware platform-specific component characteristics model 574. Component characteristics model 574 is shown here intersecting in part with storage locations of the synthesizer 572. One of skill in the art recognizes that the organization, packaging, and degree of integration among the synthesizer, component characteristics model, and other EDA constituents can vary from implementation to implementation.

Input/output 530 includes network communications circuitry 532. Network communications circuitry 532 represents circuitry to adapt general purpose computer 500 to an external data communications network 590 such as a LAN or the Internet.

Storage device 560 includes media 562. Media 562 represents apparatus to hold computer data representations. Media 562 may be removable from storage device 560 or may be fixed. A hard disk platter is an example of a fixed storage medium, while a CD-ROM or DVD disk is an example of a removable storage medium. Medium 562 is shown to include stored computer data value (not individually shown) for EDA software and related data 580. EDA 580 includes stored data values for synthesizer software (program logic and related data) 572 and component characteristics model 584. Hardware characteristics model 584 is shown here intersecting in part with storage locations of the synthesizer 582. As above, one of skill in the art recognizes that the organization, packaging, and degree of integration among the synthesizer, component characteristics model, and other EDA components can vary from embodiment to embodiment.

In one embodiment practicing inventive aspects, EDA software including a component characteristics model such as that produced by the process depicted in described in relation to FIG. 1 above, is stored on a removable storage medium such as a CD-ROM. Storage on a removable medium facilitates portability and distribution. The removable medium can then be placed in a compatible storage device and its recorded data used by CPU/processing hardware (510). In the computer system of FIG. 5, for example, EDA computer information 580 of media 562 in storage device 560 can be partly or wholly copied to locations 570 in storage 520, and accessed on a high-speed basis by CPU 510 to perform EDA data processing operations such as circuit synthesis on computer 500. Transfer of the information from media 562, including hardware characteristics model information, to storage 520 can occur using signals from storage device 560 directly to input/output circuitry 530. Alternatively, transfer of the information can use signals transmitted over a network 590. Circuit synthesis performed by computer 500 using a hardware characteristics model according to inventive aspects (to condition programmatic choices made during circuit synthesis) yields better tailored circuit designs utilizing fewer overall computing resources. These represent some advantages of inventive aspects disclosed herein.

What is claimed is:

1. A method for producing a hardware platform characteristics model for characteristics-based conditional selections by circuit synthesis computing apparatus, comprising:
synthesizing each circuit design of a plurality of circuit designs stored in a computer storage to produce for each said circuit design a synthesis model having at least one component having a component type, and to produce for each said circuit design a hardware design instance for a first target hardware platform, said hardware design instance having characteristics data;
correlating a portion of said characteristics data from a plurality of said hardware design instances that is related to said component type; and
assigning a characteristics related value to said component type based at least in part on said characteristics data correlated to said component type, wherein said characteristics related value is stored in a computer storage for a component characteristics model corresponding to said first target hardware platform.

2. The method of claim 1 wherein said characteristics data comprises performance data.

3. The method of claim 2 wherein said performance data comprises data related to timing.

4. The method of claim 3 wherein said data related to timing comprises data related to a delay time.

5. The method of claim 1 wherein said characteristics data comprises physical data.

6. The method of claim 5 wherein said physical data comprises data relating to at least one of area and capacitance.

7. The method of claim 1 further comprising generating said plurality of circuit designs by automated means.

8. The method of claim 1 wherein said plurality of circuit designs comprises a first group of circuit designs each circuit design of said first group comprising a component having an common component type and wherein said first group comprises a large number of circuit designs.

9. The method of claim 8 wherein the first group comprises about one thousand or more circuit designs.

10. The method of claim 1 wherein said plurality of circuit designs comprises a group of circuit designs for each component type of a majority of the component types present in said plurality of circuit designs, each said group of said circuit designs corresponding to one component type of said majority of component types and comprising a large number of circuit designs wherein each circuit design of said large number of circuit designs comprises a component of said corresponding component type.

11. The method of claim 10 wherein each said group comprises about one thousand or more circuit designs.

12. The method of claim 1 wherein each of said plurality of circuit designs is a simple circuit design.

13. The method of claim 12 wherein said plurality of circuit designs comprises a first group of circuit designs each comprising a component having a common component type and wherein said first group comprises a large number of circuit designs.

14. The method of claim 13 wherein the first group comprises about one thousand or more circuit designs.

15. The method of claim 14 wherein said plurality of circuit designs comprises a group of circuit designs for each component type of a majority of the component types present in said plurality of circuit designs, each said group of said circuit designs corresponding to one component type of said majority of component types and comprising a large number of circuit designs wherein each circuit design of said large number of circuit designs comprises a component of said corresponding component type.

16. The method of claim 15 wherein each said group comprises about one thousand or more circuit designs.

17. The method of claim 16 wherein each circuit design of said plurality of circuit designs comprises 5 or fewer components.

18. The method of claim 17 wherein said plurality of circuit designs comprises a group of circuit designs for each component type of a majority of the component types present in said plurality of circuit designs, each said group of said circuit designs corresponding to one component type of said majority of component types and comprising a large number of circuit designs wherein each circuit design of said large number of circuit designs comprises a component of said corresponding component type.

19. The method of claim 18 wherein each said group comprises about one thousand or more circuit designs.

20. The method of claim 1 wherein said assigning is further based at least in part on a statistical calculation using characteristics data correlated to said component type from a plurality of said hardware models.

21. The method of claim 20 wherein said statistical calculation comprises calculation of an average.

22. An article comprising a non-transitory computer usable medium having computer readable program code embodied therein, which when executed by a computer performs the method of claim 1.

23. An article comprising a non-transitory computer usable medium having computer readable program code embodied therein, which when executed by a computer performs the method of claim 4.

24. An article comprising a non-transitory computer usable medium having computer readable program code embodied therein, which when executed by a computer performs the method of claim 6.

25. An article comprising a non-transitory computer usable medium having computer readable program code embodied therein, which when executed by a computer performs the method of claim 7.

26. An article comprising a non-transitory computer usable medium having computer readable program code embodied therein, which when executed by a computer performs the method of claim 8.

27. An article comprising a non-transitory computer usable medium having computer readable program code embodied therein, which when executed by a computer performs the method of claim 10.

28. An article comprising a non-transitory computer usable medium having computer readable program code embodied therein, which when executed by a computer performs the method of claim 12.

29. An article comprising a non-transitory computer usable medium having computer readable program code embodied therein, which when executed by a computer performs the method of claim 13.

30. An article comprising a non-transitory computer usable medium having computer readable program code embodied therein, which when executed by a computer performs the method of claim 15.

31. An article comprising a non-transitory computer usable medium having computer readable program code embodied therein, which when executed by a computer performs the method of claim 18.

32. A method for producing a hardware platform characteristics model for characteristic-based conditional selections by circuit synthesis computing apparatus, comprising:
  generating synthesis models for each circuit design of a plurality of circuit designs stored in a computer storage, said synthesis models comprising circuits paths having components identified each by a type;
  generating target hardware design instances for said plurality of circuit designs, said target hardware design instances comprising subcircuit characteristics information values and each corresponding to a first target hardware platform;
  correlating said subcircuit characteristics information values to corresponding circuit paths of said synthesis models;
  attributing characteristics information sample values to respective types of identified components of said corresponding circuit paths, wherein the characteristics information sample values are derived at least in part from said correlated subcircuit characteristics information values; and
  assigning a characteristics information value to each of said component types to which a characteristics information sample value has been attributed, wherein said characteristics information value is derived at least in part from said characteristics information sample values attributed to said component type, and wherein said characteristics information value is stored in a computer storage for a component characteristics model corresponding to said first target hardware platform.

33. The method of claim 32 wherein said plurality of circuit designs substantially comprises simple circuit designs.

34. The method of claim 33 wherein each of said simple circuit designs comprises 5 or fewer components.

35. The method of claim 32 wherein said plurality of circuit designs comprises, for each of a significant proportion of the component types existing among said plurality of circuit designs, a large group of circuit designs each having a component with the respective component type.

36. The method of claim 35 wherein each said group of circuit designs substantially comprises simple circuit designs.

37. The method of claim 36 wherein each of said simple circuit designs comprises 5 or fewer components.

38. An article comprising a non-transitory computer usable medium having computer readable program code embodied therein, which when executed by a computer performs the method of claim 32.

39. An article comprising a non-transitory computer usable medium having computer readable program code embodied therein, which when executed by a computer performs the method of claim 33.

40. An article comprising a non-transitory computer usable medium having computer readable program code embodied therein, which when executed by a computer performs the method of claim 34.

41. An article comprising a non-transitory computer usable medium having computer readable program code embodied therein, which when executed by a computer performs the method of claim 35.

42. An article comprising a non-transitory computer usable medium having computer readable program code embodied therein, which when executed by a computer performs the method of claim 36.

43. An article comprising a non-transitory computer usable medium having computer readable program code embodied therein, which when executed by a computer performs the method of claim 37.

44. A method for producing a hardware platform characteristics model for characteristic-based conditional selections by circuit synthesis computing apparatus, said method comprising:
   identifying a plurality of synthesis model component types;
   for each of said synthesis model component types, identifying a plurality of circuit designs comprising a large group of simple circuit designs having a component of the respective synthesis model component type, wherein each said plurality of circuit designs is stored in a computer storage;
   generating at least one synthesis model for each circuit design of said plurality of circuit designs, each synthesis model comprising a circuit path comprising one or more components, each such component associated with a type selected from said synthesis model component types;
   generating a target hardware design instance for each circuit design of said circuit designs, each said target hardware design instance corresponding to a first target hardware platform and comprising subcircuit characteristics information values;
   correlating said subcircuit characteristics information values to corresponding circuit paths of said synthesis models;
   attributing to the associated synthesis model component type for each component in each circuit path, a characteristics information sample value derived at least in part from subcircuit characteristics information values correlated to said circuit path; and
   assigning a characteristics information value to each synthesis model component type of said synthesis model component types, said characteristics information value derived at least in part from said characteristics information sample values attributed to said synthesis model component type, and wherein said characteristics information value is stored in a computer storage for a component characteristics model corresponding to said first target hardware platform.

45. An article comprising a non-transitory computer usable medium having computer readable program code embodied therein, which when executed by a computer performs the method of claim 44.

46. Circuit synthesis computing apparatus comprising:
   a CPU coupled to a memory wherein said memory comprises:
   first memory locations having electronic design automation (EDA) software for accessing a circuit design as input, synthesizing said circuit design, and storing a synthesized representation of said circuit design as output; and
   second memory locations having high-sample probabilistic model (HSPM) component characteristics information and accessed by said EDA software of said first memory locations to direct conditional selection processing, wherein said HSPM component characteristics information is produced by the method of claim 1.

* * * * *

UNITED STATES PATENT AND TRADEMARK OFFICE
CERTIFICATE OF CORRECTION

PATENT NO.        : 8,756,540 B1
APPLICATION NO.   : 12/229816
DATED             : June 17, 2014
INVENTOR(S)       : Baeckler It is certified that error appears in the above-identified patent and that said Letters Patent is hereby corrected as shown below:

Please delete Patent 8756540 in its entirety and insert Patent 8756540 in its entirety as shown on the attached pages Signed and Sealed this
Fifteenth Day of September, 2015

Michelle K. Lee
*Director of the United States Patent and Trademark Office*

(12) United States Patent
Baeckler et al.

(10) Patent No.: US 8,756,540 B1
(45) Date of Patent: Jun. 17, 2014

(54) METHOD AND APPARATUS FOR EXTRACTED SYNTHESIS GATE CHARACTERISTICS MODEL

(75) Inventors: Gregg William Baeckler, San Jose, CA (US); Babette Van Antwerpen, Mountain View, CA (US)

(73) Assignee: Altera Corporation, San Jose, CA (US)

(*) Notice: Subject to any disclaimer, the term of this patent is extended or adjusted under 35 U.S.C. 154(b) by 1222 days.

(21) Appl. No.: 12/229,816

(22) Filed: Aug. 27, 2008

(51) Int. Cl.
 *G06F 17/50* (2006.01)
 *G06F 12/08* (2006.01)

(52) U.S. Cl.
 CPC .................................... *G06F 12/08* (2013.01)
 USPC .......................................... 716/104; 716/101

(58) Field of Classification Search
 USPC .................................... 716/100–108
 See application file for complete search history.

(56) References Cited

U.S. PATENT DOCUMENTS

| | | | |
|---|---|---|---|
| 6,463,567 B1* | 10/2002 | Kozai | 716/103 |
| 6,643,832 B1* | 11/2003 | Ray et al. | 716/108 |
| 7,337,100 B1* | 2/2008 | Hutton et al. | 703/13 |
| 2004/0243964 A1* | 12/2004 | McElvain et al. | 716/12 |
| 2007/0157138 A1* | 7/2007 | Ciolfi et al. | 716/4 |

OTHER PUBLICATIONS

De Micheli, G., Synthesis and Optimization of Digital Circuits, 1994, Chapter 8.6, pp. 418-426, McGraw Hill, Inc., Stanford University.
Rubin, S. M., Computer Aids for VLSI Design, 1994, Chapter 6, pp. 1-6, http://www.rulabinsky.com/cavd/text/chap06-5.html.
Schlip, W. J. et al., "Unit Delay Simulation with the Inversion Algorithm," IEEE, 1996.

* cited by examiner

*Primary Examiner* — Binh Tat
(74) *Attorney, Agent, or Firm* — Mauriel Kapouytian Woods LLP; Michael Mauriel

(57) ABSTRACT

Method and apparatus are described for improved circuit synthesis by EDA machinery. Circuit designs are synthesized to a target hardware platform with resulting hardware characteristics correlated back to component types in the synthesis-stage circuit design. The accumulated characteristics samples then contribute to a characteristics value for the component type. The characteristics value can be used in future synthesis runs to condition processing, e.g., choosing between alternative implementation possibilities, using the characteristics value to provide an accurate prediction of a hardware implementation for the component type.

46 Claims, 6 Drawing Sheets

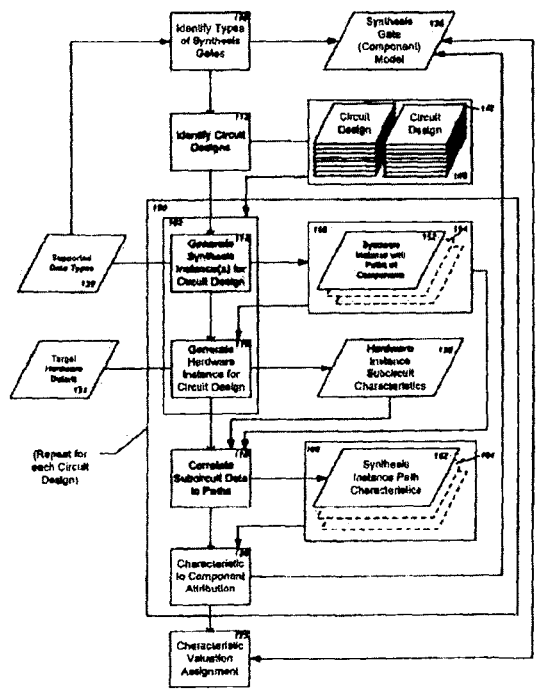

*(A)*

*(B)*

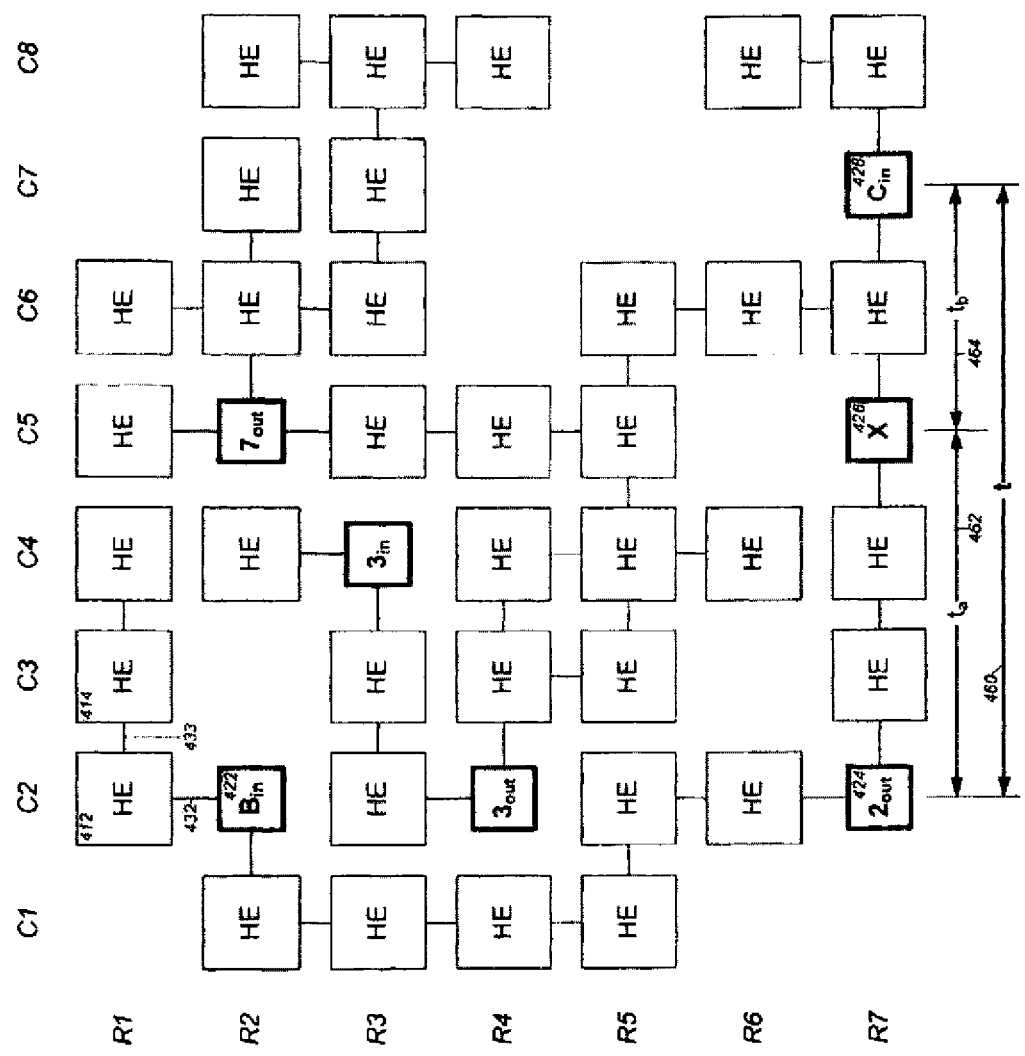

METHOD AND APPARATUS FOR EXTRACTED SYNTHESIS GATE CHARACTERISTICS MODEL

BACKGROUND

In modern electronic engineering practice, new functional circuitry is designed by preparing a circuit description in computer readable format. For maximum efficiency, even the most detailed circuits are prepared as a description of desired function rather than as a description of a precise hardware implementation. EDA (electronic design automation) software processes the functional circuit description to eventually produce an exact and specific implementation for a chosen target hardware platform.

A synthesizer component of EDA software plays a major role in the movement from functional to hardware-specific circuit design. Synthesizer software, generally executed on a general purpose computing platform, constantly makes choices and trade-offs from among the myriad of possible combinations of abstract synthesis or concrete hardware elements that could effect the functional design. The choices and trade-offs are conditioned by synthesizer design and control information that may be dynamically evaluated. Improvements in the dynamic evaluation can result in better target hardware implementations.

SUMMARY

Aspects of the invention provide methods and apparatus for improved circuit synthesis by EDA machinery. Improved circuit synthesis results because the synthesizer apparatus conditions circuit design choices based on more accurate predictions of characteristics, such as delay time, that a number of circuit design alternatives would each have when physically implemented in the target hardware.

In one aspect of the invention a method is disclosed for producing a component characteristics model for a target hardware platform wherein a large number of small circuit designs are fully synthesized. Various outputs of the synthesis are further processed to yield a component characteristics model that includes, for each type of synthesis gate in the model, characteristics information that accurately reflects the likely hardware implementation for that gate. Characteristics information in the model may include, for example, delay time.

In another aspect of the invention, electronic design automation (EDA) apparatus is disclosed including a synthesizer utilizing a component characteristics model such as that produced by the aforementioned method.

In another aspect of the invention, apparatus is disclosed useful to supply a component characteristics model such as that produced by the aforementioned method to computing machinery configured to perform EDA processing.

These and other aspects of the invention will become apparent to one of skill in the art after reading the detailed description that follows.

BRIEF DESCRIPTION OF THE DRAWINGS

FIG. 1 depicts a flow chart for one embodiment practicing inventive aspects.

FIG. 2 (A-D) depicts illustrative circuit designs as may be useful in characteristics model development.

FIG. 3 (A-C) depicts synthesis designs associated with an underlying circuit design.

FIG. 4 depicts a target hardware design portion associated with an underlying circuit design.

FIG. 5 depicts an exemplar computer system configuration for employing aspects of the invention.

DETAILED DESCRIPTION

Methods and apparatus are described below that can produce more highly optimized EDA circuit synthesis. Better synthesis is obtained than before possible because synthesizer decision-making is conditioned at the more abstract synthesis modeling stages using inventive synthesis gate models. The inventive synthesis gate models more accurately reflect characteristics of the resultant target hardware model when implemented.

The descriptions below include a large amount of detail in order to aid a clear understanding of what has been invented. Many implementations employing the inventive matter are possible and implementation details shown and discussed for the described embodiments should not be considered as limiting the scope of the invention. Similarly, much unnecessary detail about the described embodiments has been omitted in order not to obscure or burden a ready understanding of the inventive matter as one of skill in the art will appreciate.

FIG. 1 depicts a flow chart for one embodiment practicing inventive aspects. In the depicted process, a synthesizer not having the benefit of the inventive synthesis models is used to synthesize a large number of small circuit designs all the way to a common specific target hardware platform. One or more characteristics for subcircuits in the resulting hardware design instances, such as delay time, are correlated back to corresponding circuit paths in synthesis circuit design instances that preceded the hardware design instances. The correlated circuit path characteristics are then attributed among the one or more components, i.e. synthesis gates (or, more specifically, their connection points), included in the circuit path. For example, a delay time value may be attributed to each of three circuit path components simply by dividing the circuit path delay time value by 3. Each attributed value is used as a sample for the component type. After all circuit designs are so processed, the aggregate samples for each component type are used to assign a characteristic value to the component type. For example, simple averaging of all delay time samples for the particular component type may be used to assign a delay time value to the component type as part of a synthesis gate model. In a preferred embodiment, the EDA synthesizer (102) used in the FIG. 1 process is subsequently adapted to operation utilizing the synthesis component model that resulted from the FIG. 1 process, yielding an enhanced EDA synthesizer with superior design choice conditional processing.

Process flow begins at block 110 where an identification is made of the specific types of synthesis gates that may be characterized by the process. The identification of the synthesis gate types results in one embodiment in a list of gate types as represented by data block 136. The list of identified types includes all of the functional circuit components recognized and supported by a targeted EDA synthesizer, from the simplest logic gates (e.g., inverters, 2-input NAND, NOR, AND, OR, and XOR gates) to the most complex components processed by the synthesizer (each, a synthesis gate or component). Data block 132 represents a list of supported gate types associated with a particular target synthesizer as may be utilized to produce the list or records of 136. Alternatively, identification of synthesis gate types can occur later in the process, such as when characteristics data for the gate types becomes available (for example, at block 120). One of skill in the art recognizes that synthesis gate types can be identified in a data processing system in ways other than making a list. For example, in another embodiment synthesis gate types can be identified by inclusion of a mark or particular value in unique data records. For another example, in other embodiments synthesis gate types can be identified by utilizing the placement of a gate type name at a particular position in a data record or data stream. Other methods and mechanisms may be used by one of skill the art to establish or recognize the identifying information of synthesis gate types.

Processing proceeds from block 110 to block 112 where circuit designs are identified. Block 140 represents a collection of individual circuit designs, such as 142, associated with the identification processing 112. Preferably, the collection 140 contains a very large number of circuit designs and each individual circuit design (e.g., 142) is very simple. Simple circuit designs are preferable because each circuit design will undergo certain EDA processing, and the computing resources for the EDA processing tends to increase nonlinearly with circuit complexity. Circuit design collection 140 preferably includes a very wide variety of the component types supported by the synthesizer, with many instances of each component type across the collection of circuit designs. Exemplar circuit designs are discussed later in reference to FIG. 2.

A circuit design, such as 142, may be in any computer readable format recognizable, directly or indirectly, to the synthesizer. In the preferred embodiment, each of the circuit designs in collection 140 is represented in VHDL format.

Identification processing 112 in one practice involves the generation of each of the circuit designs in collection 140. A preferred embodiment includes the parameter driven automated generation of VHDL for such circuit designs. Various tools and approaches may be employed for automated generation of circuit designs. The following references can be appreciated: (i) M. Hutton, J. P. Grossman, J. Rose and D. Corneil, "Characterization and Parameterized Random Generation of Combinational Benchmark Circuits", IEEE Transactions on CAD 17:10, October, 1998, pp. 985-996; (ii) K. Prakobwaitayakit, K. and N. Fujii, "A Neural Network Approach to Circuit Topology Generator," Circuits and Systems, IEEE APCCAS, 2000, pp. 93-96; and (iii) HDLMaker user guide and software by Polybus Systems Corp. of Westford, Mass. (http://www.polybus.com/hdlmaker/users guide). In other practices, identification processing 112 may involve the specification, recognition, recordation, locating, or user solicitation, for example, of the name of a computer file system directory that contains a collection of circuit designs such as 140. In other practices, identification processing 112 may involve similar actions with regards to a computer text file containing the names or other locating information for further computer system files that have circuit designs.

Many alternatives are available for the particulars of circuit design identification processing. As another example, identification processing 112 may be segmented with a first subset of circuit design collection 140 being identified, followed by other processing, followed by the identification of a second subset of circuit design collection 140, and so on.

Circuit design collection 140 preferably includes for a significant proportion of the different synthesis gate types, a large number of circuit designs including that particular gate type. Circuit design collection 140 preferably includes for many, most, almost all, or all synthesis gate types about 200 or more individual circuit designs, and even more preferably about 500 or more individual circuit designs, even more preferably about 1,000 or more individual circuit designs, and even more preferably about 2,000 or more individual circuit designs, and somewhat more preferably about 5,000 or more individual circuit designs. All of the circuit designs within collection 140 that contain a particular type component in common may be viewed logically together as a group within the overall collection, and a circuit design with multiple component types will obviously belong to multiple such groups.

Processing proceeds from block 112 to block 114. Box 102 indicates that the processing of blocks 114 and 116 is performed using the EDA tool (including synthesizer) that is targeted for the characteristics model produced by the process depicted here in FIG. 1. The EDA tool of the preferred embodiment is Quartus® II product from Altera Corporation, 101 Innovation Drive, San Jose, Calif. Moreover, the processing of block 114 begins a portion of the overall process depicted in FIG. 1, that is repeated for each of the individual circuit designs, such as 142, in collection 140. This repeated portion of the process is identified by box 190.

At block 114 the EDA synthesizer reads a circuit design from collection 140 producing one or more instances of synthesized circuit designs 150. Block 152 with a solid outline represents a synthesized version or instance of the input circuit design. Other blocks within block 150 having a dashed outline, such as block 154, represent other instances that may be generated by a synthesizer to move the circuit design from its input functional representation to a particular instance or implementation of target hardware circuit elements that effect the function represented in the circuit design. The use of multiple stages of synthesis in EDA processing is a well understood in the art. In the preferred embodiment, the various instances of a circuit as synthesized can be captured in computer readable form for subsequent processing as represented by the contents of block 150. Examples of varying instances are discussed later in relation to FIG. 3.

Generally speaking, the input circuit design will contain synthesis components with the highest level of functional abstraction. Later instances of the synthesized circuit tend to progressively move the circuit design to implementation with components of lower abstraction until an unabstracted hardware design instance is generated. Each synthesized circuit design will include circuit paths. Each circuit path includes two recognizable end points and one or more circuit components connected therebetween (i.e., a string of components). In the preferred embodiment, the endpoints are register inputs or outputs recognized by name.

Processing proceeds from block 114 to block 116 where a hardware design instance is generated for the input circuit design using the results of the earlier synthesis processing. Block 116 generates the hardware design instance using circuit element, performance, physical, and other information for a specific target hardware platform as represented by block 134. The hardware design instance for a circuit design, such as that represented by block 138, will include subcircuits that each include two recognizable end points and one or more hardware circuit elements connected therebetween (i.e., a string of hardware elements). The hardware design instance 138 includes information regarding characteristics, such as delay time, including those for individual subcircuits. The characteristics information is highly accurate, based on a known and proven physical implementation. (While delay time is used repeatedly herein as an example to discuss characteristics information, one familiar with the art understands that many other types of characteristics information are possible. Capacitance and die area are but two further specific examples with more broadly defined categories including, for example, operational performance, electrical properties, dimensional properties, and more broadly, physical properties information.) Where the target hardware platform is an FPGA, the characteristics information will generally have been provided by the manufacturer of the particular FPGA part. As another example, where the target hardware platform is an ASIC manufactured using a specific process technology, the characteristics information will generally have been provided by the developer of the process technology. In the preferred embodiment, endpoints of subcircuits include points in the circuitry that correspond to the register inputs and outputs serving as endpoints for paths in the related synthesis instances, and can be matched by name.

Processing proceeds to block 118 where characteristics information of the hardware design instance is correlated with the paths in the earlier related synthesis design instances. A particular circuit path in a synthesis design instance is identified by the names of its endpoints, and characteristics information regarding a subcircuit with corresponding endpoints is identified within the hardware design instance 138. The characteristics information is then associated with the synthesis design instance circuit path. This association is represented in FIG. 1 by box 160. Box 160 includes three data blocks; one having a solid outlined 162, and two having dashed outlines, such as 164. Box 160 and its contents parallel that of box 150. The parallelism is intended to depict that the correlation processing of box 118 is preferably performed for the paths of all available instances of the synthesized circuit design, without specific regard to its level of abstraction or the stage at which it was produced. Taking advantage of all reasonable synthesis instances produced by EDA processing of the input circuit design increases the number of samples contributed by the individual circuit design. Accordingly, fewer computing resources are required to be expended to generate sufficient samples to achieve desirable levels of component characteristics accuracy in the synthesis gate model produced by the process of FIG. 1.

Processing proceeds to block 120 where the characteristics information now associated with synthesis instance paths is attributed to the specific types of the individual components within those paths. In the preferred embodiment that creates a synthesis gate model having delay time characteristics information, attribution is generally performed by calculating for each component in the path an equal portion of the overall delay time for the path. The value attributed to each component is then used as one sample for the type of the component. For example, the value attributed to a particular 2-input NAND gate identified as GATE137 (not illustrated) within a synthesis circuit design instance, such as 152 of FIG. 1, becomes a sample for the generic 2-input NAND gate type, as opposed to a sample for the specific GATE137. Attribution resulting in gate type samples is represented in FIG. 1 by the arrow directed from block 120 to block 136.

Processing proceeds to step 122 after the processing of block 120 for the last of the collection of circuit designs 140. At block 122, a characteristic information assignment takes place for each of the component types having samples according to the processing of box 190. The processing of block 122 results in a synthesis component characteristics model associated with the same target hardware platform as is block 134. Assignment and recordation in computer readable form of the characteristic information for the component types in the synthesis model is represented in FIG. 1 by the line connecting blocks 122 and 136.

In some cases, assignment may be as straightforward as merely averaging together the values of all the related numerical samples for the component type. For example, all of the delay time samples for the single select input on a 2-input mux can be averaged and the result assigned as the characteristic value for the select input. A simple average is only one example and assignment processing may advantageously employ one or more different calculation processing, including other statistical calculations such as the median or removal of outlying values. Different assignment processing can be used, for example, to achieve particular design goals or exploit information known about particular target hardware platform technologies. The simple average produces an accurate model with economical computing resources.

In a preferred embodiment, all of the delay time samples for both of the data inputs of a 2-input AND are averaged together and the result is assigned as the characteristic value to each of the two data inputs. Such balancing can be implemented wherever reasonably expected from the physical implementation (for example, as here, where it is reasonable to expect the same time delay to output from either input on an AND gate). In the case of the 2-input mux, the select (control) input would not be balanced with the two data inputs of the mux because it is reasonable to expect those input types (data and control) to behave differently and have different typical delay time characteristics.

The combination of reasonable assignment processing at the output and a large number of circuit designs at the input contributes to the predictive accuracy characteristic of data of a high-sample probabilistic model (HSPM) for a target hardware platform. The synthesis component model that is output by block 122, as represented by block 136, is preferably in a form and format that facilitates its subsequent integration with components of EDA computing machinery to influence the conditional processing effecting EDA internal design choices. In one embodiment, the synthesis model can be selectively represented as computer program-like "case" statements or as a tabular format. In either case the representation is recognized by an EDA synthesizer as a timing model in this example. In a preferred embodiment, the same EDA synthesizer (102) used in the FIG. 1 process is the one subsequently adapted to operation utilizing the synthesis component model (136) that resulted from the FIG. 1 process, yielding an enhanced EDA synthesizer with superior design choice conditional processing. The process of FIG. 1 can be advantageously repeated to yield different component characteristic models for a common synthesizer targeting different hardware platforms, and, similarly repeated to yield different component characteristic models for a common hardware platform targeted by different synthesizers.

FIG. 2 (A-D) depicts illustrative circuit designs as may be useful in characteristics model development. In a preferred embodiment, circuit designs include register elements at inputs and outputs. Use of the registers facilitates recognition and collection of desired characteristics data (e.g., delay time) where the synthesizer can report hardware design characteristics for each register-to-register subcircuit. Register elements in the circuit design serve as a convenient common thread that carry forward from the circuit design to serve as component path endpoints in a synthesis design instance, and forward to serve as subcircuit endpoints in a hardware design instance. Subcircuit characteristics information for a hardware design instance can then be readily correlated back to corresponding synthesis design paths in the production of a synthesis characteristics model.

In a preferred embodiment, circuit designs are simple, being limited to a small number of synthesis gates (components) in addition to the aforementioned registers. Circuit designs of small component count advantageously reduce computing resources used in production of a synthesis characteristics model by avoiding geometric expansion concerns with EDA tools and by permitting simple attribution and evaluation processes to be utilized while still producing results with good accuracy. A preferred collection of circuit designs (such as 140 of FIG. 1) used in the production of a synthesis characteristics model has mostly, is predominated by, or consists almost completely of circuit designs having about 10 or fewer components, and preferably about five or fewer components, even more preferably four or fewer components, even more preferably three or fewer components, even more preferably two or fewer components, and even more preferably about one component. The aforementioned component counts are in addition to registers at inputs and outputs as discussed earlier. An incidental number of minor or trivial gates may also be omitted from the count when assessing the number of components in a circuit design. This small component count stands in stark contrast to the typical circuit design having a component count magnitudes greater.

FIG. 2A depicts an exemplar circuit design with an adder function block. Adder 210 has eight inputs, labeled a1-a4 and b1-b4, and four outputs, labeled s1-s4. Each input and output is connected to a register element. For example, register 1 (220) appearing to the input side of adder 210 has an input 222, an output 224, and has its output 224 connected to adder input a1. As another example, adder 210 output s1 is connected to the input of register A (228). In sum, the eight adder inputs, a1-a4 and b1-b4, are connected to the outputs of registers 1-8, respectively; and the four adder outputs, s1-s4, are connected to the inputs of registers A-D, respectively.

FIG. 2B depicts an exemplar circuit design with a 4-to-1 mux. Mux 230 has four data inputs, labeled a-d, connected to the outputs of four registers, labeled 1-4, respectively. Mux 230 has two select inputs, labeled s0 and s1, respectively connected to the outputs of two registers similarly labeled. Mux 230 has one data output, labeled q, connected to the input of register A (248).

FIG. 2C depicts an exemplar circuit design with a 2-to-1 mux. Mux 250 has two data inputs, labeled a and b, respectively connected to the outputs of two similarly labeled registers. Mux 250 has one select input, labeled s, connected to the output of a similarly labeled register 264. Mux 250 has one data output, labeled q, connected to the input of similarly labeled register 262.

FIG. 2D depicts an exemplar multicomponent circuit design that combines a 2-to-1 mux such as that of FIG. 2C (250) with an adder such as that of FIG. 2A (210). Mux 270 of FIG. 2D has two data inputs, labeled a and b, connected to the outputs of two registers, labeled 8a and 8b, respectively. Mux 270 has one select input, labeled s, connected to the output of a register 282, labeled S. Mux 270 has one data output, labeled q, connected directly to the input labeled b4 of adder 272. The remaining inputs of adder 272, labeled a1-a4 and b1-b3, are connected to the outputs of registers, labeled 1-7, respectively. The outputs of adder 272, labeled s1-s4, are connected to the inputs of registers, labeled A-D, respectively.

FIG. 3 (A-C) depicts synthesis designs associated with an underlying circuit design. Each is illustrative of a synthesis circuit instance that may result from EDA processing of the adder circuit design of FIG. 2A. Each is illustrative of a synthesis circuit instance such as illustrated and discussed in relation to FIG. 1 (152,154). FIG. 3A depicts an instance of the synthesized circuit design using a bus adder 310. Bus registers 320, 322 supply four individual input signals each to bus adder 310. Bus register 328 receives four individual output signals from bus adder 310. A component path is highlighted by bolding in FIG. 3A for purposes of illustration. The component path traverses from bus register 320 (bit 2, not individually shown) to bus register 328 (bit C, not individually shown) and is illustrated by the bold outline of bus adder 310 and the bold lines connecting adder 310 with those registers 320,328.

FIG. 3B depicts an instance of the synthesized circuit design using a bit adder 330. The exemplar synthesis design instance of FIG. 3B substantially replicates the underlying circuit design depicted in FIG. 2A. The component path corresponding to the one highlighted in FIG. 3A is highlighted by bolding in FIG. 3B. The component path traverses from register 2 (340) to register C (348) and is illustrated by the bold outline of bit adder 330 and the bold lines connecting adder 330 with those registers 340, 348.

FIG. 3C depicts an instance of the synthesized circuit design using four full adders, 350-356. In addition to two data inputs and a sum output, each full adder, such as 352, has a carry in (CI) input to receive a carry signal from a lower magnitude stage and a carry forward (CF) output to send a carry signal to a higher magnitude stage. The component path corresponding to the one highlighted in FIG. 3A is highlighted by bolding in FIG. 3C. The component path traverses from register 2 (360) to register C (368) and is illustrated by the bold outlines of full adders 352,354, the bold line between register 2 (360) and full adder 352, the bold line 370 connecting the carry forward output of full adder 352 to the carry forward input of full adder 354, and the bold line connecting between full adder 354 and register C (368).

Preferably, component paths of the synthesis design instances can be identified at fine enough resolution to exclude any circuitry of the input and output registers and isolate the component path definition from a register output connection point to a register input connection point. Embodiments that include all or part of register circuitry in the identifiable component paths preferably compensate for the presence of registry circuitry, for example, by making corresponding adjustments when attributing characteristics values to components in the path (e.g., make a corresponding reduction in delay time values). Good results may, however, be achieved in embodiments not making such consideration for register circuitry at the periphery of component paths.

FIG. 4 depicts a target hardware design portion associated with an underlying circuit design. FIG. 4 is a highly stylized illustration of a portion of circuitry of a hardware design instance as might result from EDA processing (such as discussed in regards to 116 of FIG. 1). Circuit elements are shown in a grid of columns C1-C8 and rows R1-R7. Blocks labeled HE represent hardware elements. For example, in an FPGA design a hardware element may be a device logic element. For another example, in an ASIC design a hardware element may be a transistor. As another example, in a mask programmed gate array design a hardware element may be a fundamental logic gate. Other blocks of FIG. 4 are smaller and bolder, and represent contact points—for example, points in the circuitry at the input or output of a particular register. Arrows 460-464 illustrate characteristics information of the hardware design instance.

FIG. 4 includes a signal path from point 424, through the hardware elements of columns C3 and C4 in row R7, through connection point 426, through the hardware element of column C6 in row R7, to connection point 428. The complete subcircuit from connection point $2_{out}$ (424) to connection point $C_{in}$ (428) illustrates a subcircuit corresponding to each of the component paths highlighted in FIG. 3A-C. Arrow 460 represents a delay time characteristic, t, for subcircuit $2_{out}$-to-$C_{in}$. Subcircuit $2_{out}$-to-$C_{in}$ includes two subcircuits. Subcircuit $2_{out}$ to-X has delay time characteristic $t_a$ (462). Subcircuit X-to-$C_{in}$ has delay time characteristic $t_b$ (462). In a preferred embodiment, a hardware design instance includes a subcircuit characteristics information item (such as t (460) that directly corresponds to a component path in a synthesis design instance (such as any of those highlighted and discussed in relation to FIG. 3). In other embodiments, a characteristics information item directly corresponding to a component path may be derived from other less direct or indirect characteristics information. For example, delay time values $t_a$ (462) and $t_b$ (464) of FIG. 4, could be added together to produce a delay time characteristics information item for subcircuit $?_{out}$-to-$C_{in}$ if value t (460) were not present in the hardware design instance.

FIG. 5 depicts an exemplar computer system configuration for employing aspects of the invention. General-purpose computer 500 includes CPU/processing hardware 510, storage 520, input/output 530, and storage device 560. CPU/processing hardware 510 represents microprocessor, multiprocessor, co-processor, or custom logic circuitry, for example, to carry out data processing functions such as the execution of computer software instructions. Storage 520 represents memory devices shown coupled to the CPU processing hardware 510 to provide it with high-speed access to program instructions and other computer data. Storage 520 may be implemented, for example, using any of a variety of RAM (e.g., SDRAM) or ROM (e.g., EEPROM) devices widely known in the art. Input/output 530 is shown coupled to CPU/processing hardware 510 and storage 520. Input/output 530 represents circuitry to interface between high-speed central processing circuitry and input/output devices. Storage device 560 is shown coupled to input/output circuitry 530. Storage device 560 may alternatively connect to computer 500 via external network 590 as in the case of a NAS storage device, as indicated by the dashed connection shown in FIG. 5. Storage device 560 represents circuitry and related apparatus used to store and/or retrieve computer data (which may include computer software). Storage device 560 generally involves persistent storage and is slower than storage 520. Storage device types useful in computer 500 include, for example, hard disk drives, optical drives such as CD-ROM, or flash memory devices such as USB sticks.

Storage 520 includes computer data storage locations (not individually shown) occupied by operating system software and related data 522, and the EDA software and related data 570. EDA locations 570 include storage locations occupied by synthesizer software and related data 572 and hardware platform-specific component characteristics model 574. Component characteristics model 574 is shown here intersecting in part with storage locations of the synthesizer 572. One of skill in the art recognizes that the organization, packaging, and degree of integration among the synthesizer, component characteristics model, and other EDA constituents can vary from implementation to implementation.

Input/output 530 includes network communications circuitry 532. Network communications circuitry 532 represents circuitry to adapt general purpose computer 500 to an external data communications network 590 such as a LAN or the Internet.

Storage device 560 includes media 562. Media 562 represents apparatus to hold computer data representations. Media 562 may be removable from storage device 560 or may be fixed. A hard disk platter is an example of a fixed storage medium, while a CD-ROM or DVD disk is an example of a removable storage medium. Medium 562 is shown to include stored computer data value (not individually shown) for EDA software and related data 580. EDA 580 includes stored data values for synthesizer software (program logic and related data) 572 and component characteristics model 584. Hardware characteristics model 584 is shown here intersecting in part with storage locations of the synthesizer 582. As above, one of skill in the art recognizes that the organization, packaging, and degree of integration among the synthesizer, component characteristics model, and other EDA components can vary from embodiment to embodiment.

In one embodiment practicing inventive aspects, EDA software including a component characteristics model such as that produced by the process depicted in described in relation to FIG. 1 above, is stored on a removable storage medium such as a CD-ROM. Storage on a removable medium facilitates portability and distribution. The removable medium can then be placed in a compatible storage device and its recorded data used by CPU/processing hardware (510). In the computer system of FIG. 5, for example, EDA computer information 580 of media 562 in storage device 560 can be partly or wholly copied to locations 570 in storage 520, and accessed on a high-speed basis by CPU 510 to perform EDA data processing operations such as circuit synthesis on computer 500. Transfer of the information from media 562, including hardware characteristics model information, to storage 520 can occur using signals from storage device 560 directly to input/output circuitry 530. Alternatively, transfer of the information can use signals transmitted over a network 590. Circuit synthesis performed by computer 500 using a hardware characteristics model according to inventive aspects (to condition programmatic choices made during circuit synthesis) yields better tailored circuit designs utilizing fewer overall computing resources. These represent some advantages of inventive aspects disclosed herein.

What is claimed is:

1. A method for producing a hardware platform characteristics model for characteristics-based conditional selections by circuit synthesis computing apparatus, comprising:
synthesizing each circuit design of a plurality of circuit designs stored in a computer storage to produce for each said circuit design a synthesis model having at least one component having a component type, and to produce for each said circuit design a hardware design instance for a first target hardware platform, said hardware design instance having characteristics data;
correlating a portion of said characteristics data from a plurality of said hardware design instances that is related to said component type; and
assigning a characteristics related value to said component type based at least in part on said characteristics data correlated to said component type, wherein said characteristics related value is stored in a computer storage for a component characteristics model corresponding to said first target hardware platform.

2. The method of claim 1 wherein said characteristics data comprises performance data.

3. The method of claim 2 wherein said performance data comprises data related to timing.

4. The method of claim 3 wherein said data related to timing comprises data related to a delay time.

5. The method of claim 1 wherein said characteristics data comprises physical data.

6. The method of claim 5 wherein said physical data comprises data relating to at least one of area and capacitance.

7. The method of claim 1 further comprising generating said plurality of circuit designs by automated means.

8. The method of claim 1 wherein said plurality of circuit designs comprises a first group of circuit designs each circuit design of said first group comprising a component having an common component type and wherein said first group comprises a large number of circuit designs.

9. The method of claim 8 wherein the first group comprises about one thousand or more circuit designs.

10. The method of claim 1 wherein said plurality of circuit designs comprises a group of circuit designs for each component type of a majority of the component types present in said plurality of circuit designs, each said group of said circuit designs corresponding to one component type of said majority of component types and comprising a large number of circuit designs wherein each circuit design of said large number of circuit designs comprises a component of said corresponding component type.

11. The method of claim 10 wherein each said group comprises about one thousand or more circuit designs.

12. The method of claim 1 wherein each of said plurality of circuit designs is a simple circuit design.

13. The method of claim 12 wherein said plurality of circuit designs comprises a first group of circuit designs each comprising a component having a common component type and wherein said first group comprises a large number of circuit designs.

14. The method of claim 13 wherein the first group comprises about one thousand or more circuit designs.

15. The method of claim 14 wherein said plurality of circuit designs comprises a group of circuit designs for each component type of a majority of the component types present in said plurality of circuit designs, each said group of said circuit designs corresponding to one component type of said majority of component types and comprising a large number of circuit designs wherein each circuit design of said large number of circuit designs comprises a component of said corresponding component type.

16. The method of claim 15 wherein each said group comprises about one thousand or more circuit designs.

17. The method of claim 16 wherein each circuit design of said plurality of circuit designs comprises 5 or fewer components.

18. The method of claim 17 wherein said plurality of circuit designs comprises a group of circuit designs for each component type of a majority of the component types present in said plurality of circuit designs, each said group of said circuit designs corresponding to one component type of said majority of component types and comprising a large number of circuit designs wherein each circuit design of said large number of circuit designs comprises a component of said corresponding component type.

19. The method of claim 18 wherein each said group comprises about one thousand or more circuit designs.

20. The method of claim 1 wherein said assigning is further based at least in part on a statistical calculation using characteristics data correlated to said component type from a plurality of said hardware models.

21. The method of claim 20 wherein said statistical calculation comprises calculation of an average.

22. An article comprising a non-transitory computer usable medium having computer readable program code embodied therein, which when executed by a computer performs the method of claim 1.

23. An article comprising a non-transitory computer usable medium having computer readable program code embodied therein, which when executed by a computer performs the method of claim 4.

24. An article comprising a non-transitory computer usable medium having computer readable program code embodied therein, which when executed by a computer performs the method of claim 6.

25. An article comprising a non-transitory computer usable medium having computer readable program code embodied therein, which when executed by a computer performs the method of claim 7.

26. An article comprising a non-transitory computer usable medium having computer readable program code embodied therein, which when executed by a computer performs the method of claim 8.

27. An article comprising a non-transitory computer usable medium having computer readable program code embodied therein, which when executed by a computer performs the method of claim 10.

28. An article comprising a non-transitory computer usable medium having computer readable program code embodied therein, which when executed by a computer performs the method of claim 12.

29. An article comprising a non-transitory computer usable medium having computer readable program code embodied therein, which when executed by a computer performs the method of claim 13.

30. An article comprising a non-transitory computer usable medium having computer readable program code embodied therein, which when executed by a computer performs the method of claim 15.

31. An article comprising a non-transitory computer usable medium having computer readable program code embodied therein, which when executed by a computer performs the method of claim 18.

32. A method for producing a hardware platform characteristics model for characteristic-based conditional selections by circuit synthesis computing apparatus, comprising:
generating synthesis models for each circuit design of a plurality of circuit designs stored in a computer storage, said synthesis models comprising circuits paths having components identified each by a type;
generating target hardware design instances for said plurality of circuit designs, said target hardware design instances comprising subcircuit characteristics information values and each corresponding to a first target hardware platform;
correlating said subcircuit characteristics information values to corresponding circuit paths of said synthesis models;
attributing characteristics information sample values to respective types of identified components of said corresponding circuit paths, wherein the characteristics information sample values are derived at least in part from said correlated subcircuit characteristics information values; and
assigning a characteristics information value to each of said component types to which a characteristics information sample value has been attributed, wherein said characteristics information value is derived at least in part from said characteristics information sample values attributed to said component type, and wherein said characteristics information value is stored in a computer storage for a component characteristics model corresponding to said first target hardware platform.

33. The method of claim 32 wherein said plurality of circuit designs substantially comprises simple circuit designs.

34. The method of claim 33 wherein each of said simple circuit designs comprises 5 or fewer components.

35. The method of claim 32 wherein said plurality of circuit designs comprises, for each of a significant proportion of the component types existing among said plurality of circuit designs, a large group of circuit designs each having a component with the respective component type.

36. The method of claim 35 wherein each said group of circuit designs substantially comprises simple circuit designs.

37. The method of claim 36 wherein each of said simple circuit designs comprises 5 or fewer components.

38. An article comprising a non-transitory computer usable medium having computer readable program code embodied therein, which when executed by a computer performs the method of claim 32.

39. An article comprising a non-transitory computer usable medium having computer readable program code embodied therein, which when executed by a computer performs the method of claim 33.

40. An article comprising a non-transitory computer usable medium having computer readable program code embodied therein, which when executed by a computer performs the method of claim 34.

41. An article comprising a non-transitory computer usable medium having computer readable program code embodied therein, which when executed by a computer performs the method of claim 35.

42. An article comprising a non-transitory computer usable medium having computer readable program code embodied therein, which when executed by a computer performs the method of claim 36.

43. An article comprising a non-transitory computer usable medium having computer readable program code embodied therein, which when executed by a computer performs the method of claim 37.

44. A method for producing a hardware platform characteristics model for characteristic-based conditional selections by circuit synthesis computing apparatus, said method comprising:
- identifying a plurality of synthesis model component types;
- for each of said synthesis model component types, identifying a plurality of circuit designs comprising a large group of simple circuit designs having a component of the respective synthesis model component type, wherein each said plurality of circuit designs is stored in a computer storage;
- generating at least one synthesis model for each circuit design of said plurality of circuit designs, each synthesis model comprising a circuit path comprising one or more components, each such component associated with a type selected from said synthesis model component types;
- generating a target hardware design instance for each circuit design of said circuit designs, each said target hardware design instance corresponding to a first target hardware platform and comprising subcircuit characteristics information values;
- correlating said subcircuit characteristics information values to corresponding circuit paths of said synthesis models;
- attributing to the associated synthesis model component type for each component in each circuit path, a characteristics information sample value derived at least in part from subcircuit characteristics information values correlated to said circuit path; and
- assigning a characteristics information value to each synthesis model component type of said synthesis model component types, said characteristics information value derived at least in part from said characteristics information sample values attributed to said synthesis model component type, and wherein said characteristics information value is stored in a computer storage for a component characteristics model corresponding to said first target hardware platform.

45. An article comprising a non-transitory computer usable medium having computer readable program code embodied therein, which when executed by a computer performs the method of claim 44.

46. Circuit synthesis computing apparatus comprising:
- a CPU coupled to a memory wherein said memory comprises:
- first memory locations having electronic design automation (EDA) software for accessing a circuit design as input, synthesizing said circuit design, and storing a synthesized representation of said circuit design as output; and
- second memory locations having high-sample probabilistic model (HSPM) component characteristics information and accessed by said EDA software of said first memory locations to direct conditional selection processing, wherein said HSPM component characteristics information is produced by the method of claim 1.

* * * * *